United States Patent
Hong et al.

(10) Patent No.: US 11,948,956 B2
(45) Date of Patent: Apr. 2, 2024

(54) IMAGE SENSORS INCLUDING AN AMORPHOUS REGION AND AN ELECTRON SUPPRESSION REGION

(71) Applicant: Samsung Electronics Co., Ltd., Suwon-si (KR)

(72) Inventors: Hyungi Hong, Seongnam-si (KR); Kook Tae Kim, Hwaseong-si (KR); Jingyun Kim, Hwaseong-si (KR); Soojin Hong, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 641 days.

(21) Appl. No.: 16/998,202

(22) Filed: Aug. 20, 2020

(65) Prior Publication Data

US 2020/0381464 A1    Dec. 3, 2020

Related U.S. Application Data

(63) Continuation of application No. 16/400,279, filed on May 1, 2019, now Pat. No. 10,784,301.

(30) Foreign Application Priority Data

Oct. 8, 2018 (KR) .................. 10-2018-0120034

(51) Int. Cl.
| H01L 27/146 | (2006.01) |
| H01L 21/265 | (2006.01) |
| H01L 21/266 | (2006.01) |

(52) U.S. Cl.
CPC .... H01L 27/1463 (2013.01); H01L 27/14685 (2013.01); *H01L 21/26513* (2013.01); *H01L 21/266* (2013.01); *H01L 27/14614* (2013.01); *H01L 27/1464* (2013.01); *H01L 27/14641* (2013.01)

(58) Field of Classification Search
CPC ........................................ H01L 27/146–14893
See application file for complete search history.

(56) References Cited

U.S. PATENT DOCUMENTS

| 7,338,880 | B2 | 3/2008 | Lim |
| 7,595,213 | B2 | 9/2009 | Kwon et al. |
| 8,815,634 | B2 | 8/2014 | Ramappa et al. |
| 9,054,003 | B2 | 6/2015 | Ahn et al. |

(Continued)

FOREIGN PATENT DOCUMENTS

| CN | 108615739 A | 10/2018 |
| JP | 2012507871 A | 3/2012 |

(Continued)

*Primary Examiner* — Kevin Parendo
(74) *Attorney, Agent, or Firm* — Myers Bigel, P.A.

(57) ABSTRACT

Image sensors are provided. An image sensor includes a substrate including a plurality of pixel areas. The substrate has a first surface and a second surface that is opposite the first surface. The image sensor includes a deep pixel isolation region extending from the second surface of the substrate toward the first surface of the substrate and separating the plurality of pixel areas from each other. The image sensor includes an amorphous region adjacent a sidewall of the deep pixel isolation region. Moreover, the image sensor includes an electron suppression region between the amorphous region and the sidewall of the deep pixel isolation region.

19 Claims, 21 Drawing Sheets

(56) References Cited

U.S. PATENT DOCUMENTS

| | | |
|---|---|---|
| 9,190,441 B2 | 11/2015 | Lai et al. |
| 9,305,947 B2 | 4/2016 | Ihara |
| 9,553,119 B2 | 1/2017 | Choi et al. |
| 10,050,078 B2 | 8/2018 | Jin et al. |
| 10,062,721 B2 | 8/2018 | Wan et al. |
| 10,170,517 B2 | 1/2019 | Lee et al. |
| 10,283,540 B2 | 5/2019 | Lee et al. |
| 10,593,719 B2 | 3/2020 | Park et al. |
| 2004/0207024 A1* | 10/2004 | Eikyu ............ H01L 29/1041 257/E21.549 |
| 2012/0068051 A1* | 3/2012 | Ahn ............ H01L 27/14603 250/208.1 |
| 2013/0113061 A1* | 5/2013 | Lai ............ H01L 31/09 257/E31.127 |
| 2014/0145251 A1* | 5/2014 | Favennec ............ H01L 21/76224 438/437 |
| 2014/0264504 A1* | 9/2014 | Kao ............ H01L 27/1464 257/292 |
| 2015/0041948 A1* | 2/2015 | Pu ............ H01L 21/76235 257/506 |
| 2017/0092684 A1* | 3/2017 | Chang ............ H01L 27/1463 |
| 2017/0179278 A1* | 6/2017 | Baldwin ............ H01L 21/2253 |
| 2017/0186805 A1 | 6/2017 | Lee et al. |
| 2018/0182790 A1* | 6/2018 | Yamaguchi ............ H01L 27/14612 |
| 2018/0190696 A1 | 7/2018 | Lee et al. |
| 2018/0301502 A1* | 10/2018 | Lee ............ H01L 27/1463 |
| 2020/0127026 A1 | 4/2020 | Ukigaya et al. |

FOREIGN PATENT DOCUMENTS

| | | |
|---|---|---|
| KR | 100652343 B1 | 11/2006 |
| KR | 10-0729742 | 6/2007 |
| KR | 20080062063 A | 7/2008 |
| KR | 10-0869750 | 11/2008 |
| KR | 20130128992 A | 11/2013 |
| KR | 20150101681 A | 9/2015 |
| WO | 2010051365 A2 | 5/2010 |

* cited by examiner

IMAGE SENSORS INCLUDING AN AMORPHOUS REGION AND AN ELECTRON SUPPRESSION REGION

CROSS-REFERENCE TO RELATED APPLICATION

This U.S. non-provisional application is a continuation of and claims priority to U.S. application Ser. No. 16/400,279 filed on May 1, 2019, which claims priority under 35 U.S.C § 119 to Korean Patent Application No. 10-2018-0120034 filed on Oct. 8, 2018 in the Korean Intellectual Property Office, the entire contents of which are hereby incorporated herein by reference.

BACKGROUND

The present disclosure relates to image sensors. An image sensor transforms optical images into electrical signals. The image sensor may be classified as a charge coupled device (CCD) type or a complementary metal oxide semiconductor (CMOS) type. The term "CIS" is short for the CMOS type image sensor. The CIS may include a plurality of two-dimensionally arranged pixels. Each of the pixels includes a photodiode (PD). The photodiode serves to transform incident light into an electrical signal.

SUMMARY

Some example embodiments of the present inventive concepts provide an image sensor capable of suppressing dark current.

Some embodiments of the present inventive concepts provide a method of manufacturing an image sensor with improved photosensitivity.

An image sensor, according to some example embodiments of the present inventive concepts, may include a substrate including a plurality of pixel areas. The substrate may have a first surface and a second surface that is opposite the first surface. The image sensor may include a transfer gate on the first surface of the substrate. The image sensor may include a deep pixel isolation region extending from the second surface of the substrate toward the first surface of the substrate and separating the plurality of pixel areas from each other. The image sensor may include an amorphous region adjacent a sidewall of the deep pixel isolation region. Moreover, the image sensor may include an electron suppression region between the amorphous region and the sidewall of the deep pixel isolation region. The electron suppression region may include boron ions.

An image sensor, according to some example embodiments of the present inventive concepts, may include a substrate including a plurality of pixel areas. The substrate may have a first surface and a second surface that is opposite the first surface. The image sensor may include a shallow device isolation region in the substrate, adjacent the first surface. The image sensor may include a deep pixel isolation region extending from the second surface toward the first surface and separating the plurality of pixel areas from each other. The deep pixel isolation region may be in contact with the shallow device isolation region. The image sensor may include an amorphous region adjacent sidewalls of the deep pixel isolation region and the shallow device isolation region, respectively. Moreover, the image sensor may include an electron suppression region between the amorphous region and the sidewalls of the deep pixel isolation region and the shallow device isolation region.

An image sensor, according to some example embodiments of the present inventive concepts, may include a substrate including a plurality of pixel areas. The substrate may have a first surface and a second surface that is opposite the first surface. The image sensor may include a device isolation region in the substrate, adjacent the first surface. The image sensor may include a deep pixel isolation region extending from the second surface toward the first surface and separating the plurality of pixel areas from each other. The image sensor may include an amorphous region adjacent sidewalls of the deep pixel isolation region. Moreover, the image sensor may include an electron suppression region between the amorphous region and the sidewalls of the deep pixel isolation region. A portion of the device isolation region may include ions of carbon, germanium, or both carbon and germanium.

A method of fabricating an image sensor, according to some example embodiments of the present inventive concepts, may include etching a substrate to form a plurality of deep pixel trenches that separate a plurality of pixel areas from each other. The method may include performing a first plasma doping process to dope the substrate with ions of carbon, germanium, or both carbon and germanium, to thereby form a first amorphous region in the substrate adjacent sidewalls and bottom surfaces of the plurality of deep pixel trenches. The method may include performing a second plasma doping process to dope the substrate with boron ions, to thereby form a first electron suppression region in the substrate adjacent the sidewalls and the bottom surfaces of the plurality of deep pixel trenches. The method may include performing an annealing process. Moreover, the method may include forming a plurality of deep device isolation regions in the plurality of deep pixel trenches.

DETAILED DESCRIPTION

Some example embodiments of the present inventive concepts will now be described in detail with reference to the accompanying drawings.

Figure 1:
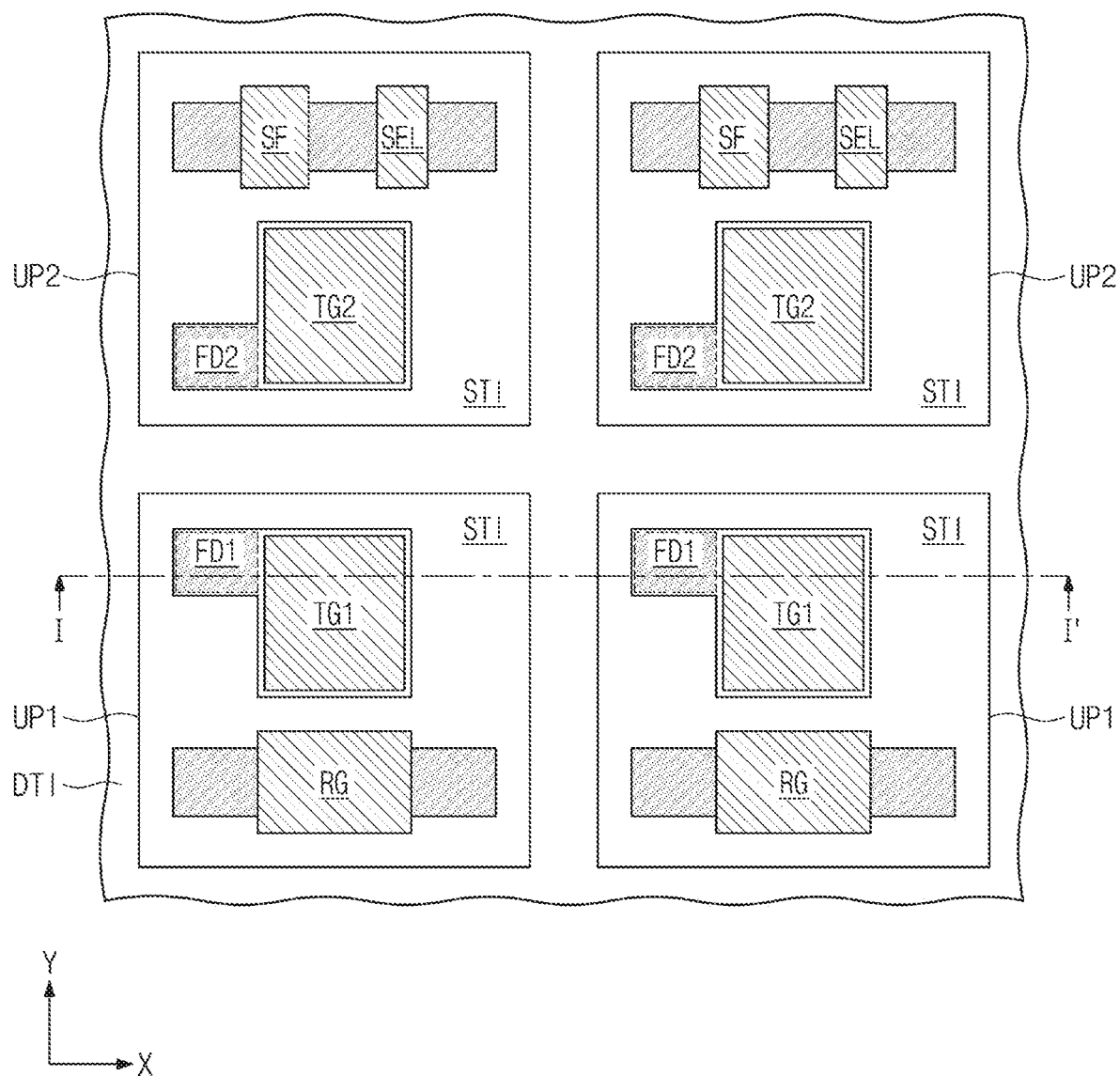
FIG. 1 illustrates a plan view showing an image sensor according to some example embodiments of the present inventive concepts.
Figure 2:
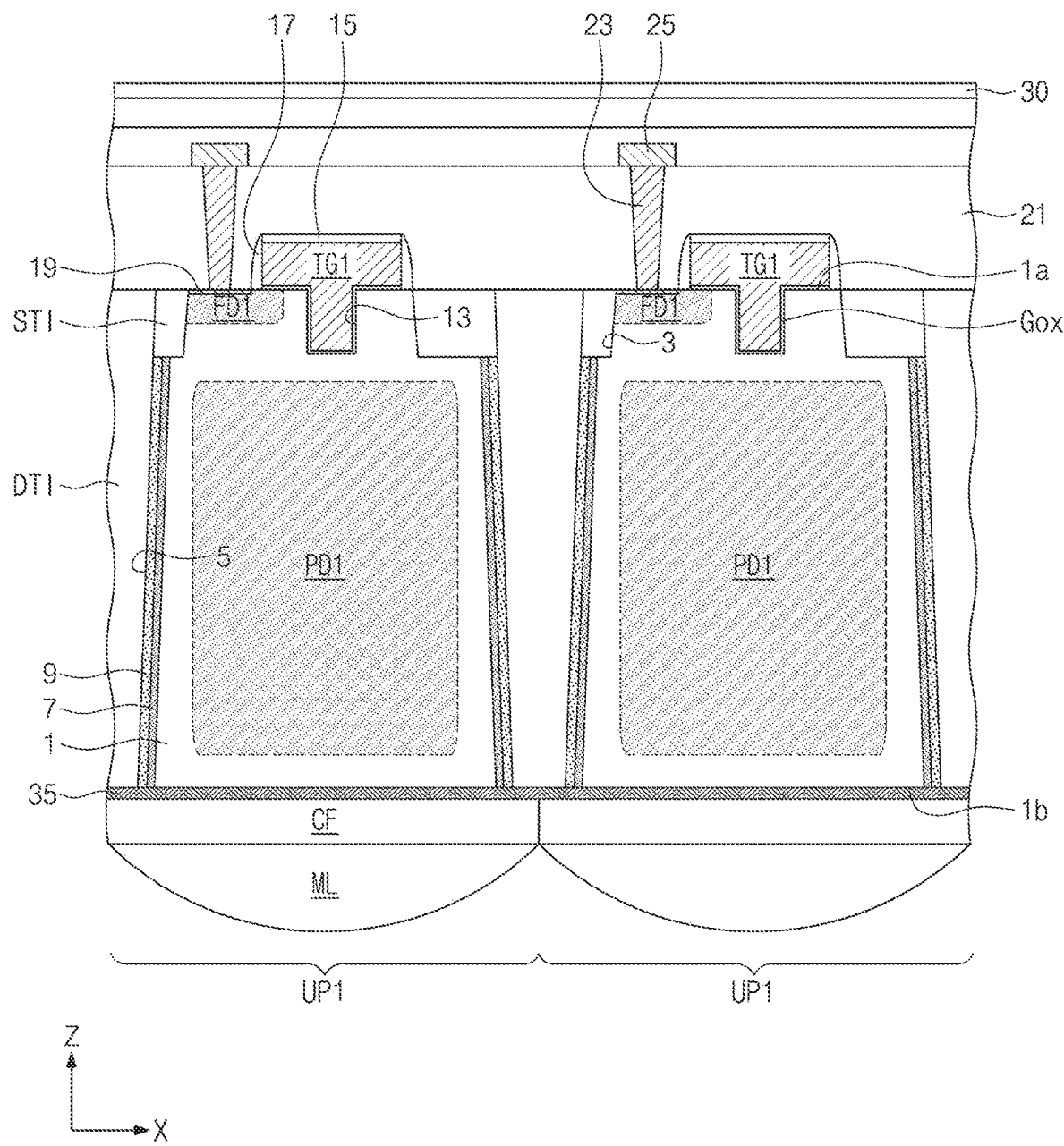
FIG. 2 illustrates a cross-sectional view taken along line I-I' of FIG. 1.
Figure 3:
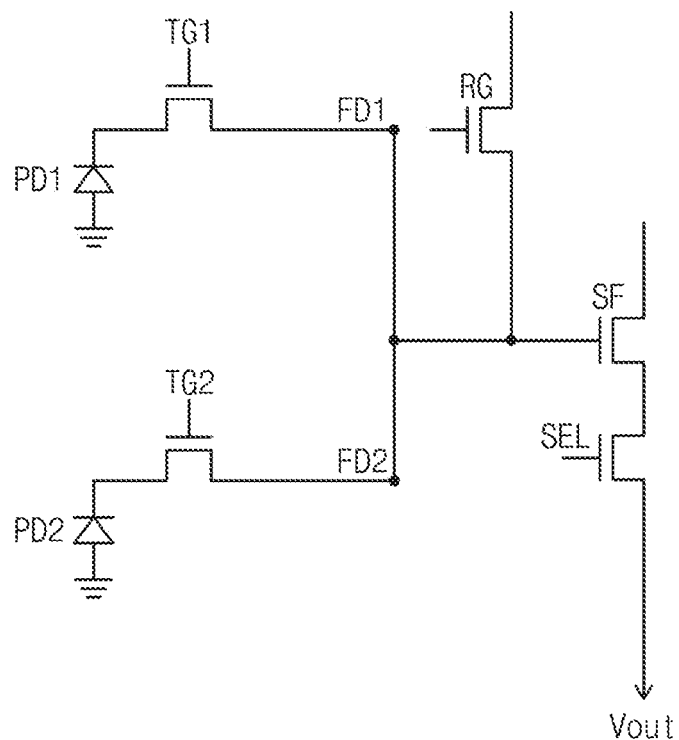
FIG. 3 illustrates a circuit diagram showing an image sensor according to some example embodiments of the present inventive concepts.

FIG. 1 illustrates a plan view showing an image sensor according to some example embodiments of the present inventive concepts. FIG. 2 illustrates a cross-sectional view taken along line I-I' of FIG. 1. FIG. 3 illustrates a circuit diagram showing an image sensor according to some example embodiments of the present inventive concepts.

Referring to FIGS. 1 and 2, a substrate 1 may be provided which includes a plurality of pixel areas UP1 and UP2. The plurality of pixel areas UP1 and UP2 may include first pixel areas UP1 and second pixel areas UP2. The first pixel areas UP1 may be linearly arranged along a first direction X. The second pixel areas UP2 may be linearly arranged along the first direction X. The first pixel areas UP1 may be spaced apart in a second direction Y from the second pixel areas UP2, wherein the second direction Y intersects the first direction X. The substrate 1 may have a first surface 1a and a second surface 1b opposite/facing each other. The first surface 1a of the substrate 1 may be called a front surface on which drive transistors are disposed. The second surface 1b may be called a rear surface. Light may be incident through the second surface 1b. An image sensor according to embodiments of the present inventive concepts may be a backside illuminated image sensor. The substrate 1 may be a single crystalline silicon wafer or an epitaxial silicon layer. The substrate 1 may be doped with P-type impurities. For example, the substrate 1 may be doped with boron.

The substrate 1 may be provided therein with a deep pixel isolation section DTI that isolates the pixel areas UP1 and UP2 from each other. As used herein, the term "section" refers to a region, such as an isolation region. The deep pixel isolation section DTI may be disposed in a deep pixel trench 5 formed in the substrate 1. The deep pixel isolation section DTI may extend to reach the second surface 1b from the first surface 1a of the substrate 1. The deep pixel isolation section DTI may penetrate the substrate 1. The deep pixel isolation section DTI may include at least one of a silicon oxide layer, a silicon nitride layer, and a silicon oxynitride layer. The deep pixel isolation section DTI may have a width that decreases as it approaches the second surface 1b from the first surface 1a.

The substrate 1 may be provided therein with a first photoelectric conversion section PD1 in each of the first pixel areas UP1 that are separated from each other by the deep pixel isolation section DTI. In some embodiments, the substrate 1 may also be provided therein with a second photoelectric conversion section PD2 (FIG. 3) in each of the second pixel areas UP2 that are separated from each other by the deep pixel isolation section DTI. The first photoelectric conversion section PD1 may be doped with impurities having an opposite conductivity type, such as N-type, to that of the impurities doped in the substrate 1. A PN junction may be formed by each of the first and second photoelectric conversion sections PD1 and PD2 and a P-type impurity region of the substrate 1, creating electron-hole pairs when light is incident.

On each of the first and second pixel areas UP1 and UP2, the substrate 1 may be provided therein with a shallow device isolation section STI defining active regions on which drive transistors are formed. The shallow device isolation section STI may be disposed in a shallow device trench 3. The shallow device isolation section STI may be disposed adjacent to the first surface 1a. The deep pixel isolation section DTI may penetrate the shallow device isolation section STI. A top surface of the deep pixel isolation section DTI may be coplanar with a top surface of the shallow device isolation section STI. The shallow device isolation section STI may include at least one of a silicon oxide layer, a silicon nitride layer, and a silicon oxynitride layer.

On the first pixel areas UP1, first transfer gates TG1 may be disposed on the first surface 1a of the substrate 1. On the second pixel areas UP2, second transfer gates TG2 may be disposed on the first surface 1a of the substrate 1. On each of the first and second pixel areas UP1 and UP2, the substrate 1 may have a recess 13 adjacent to the first surface 1a. The recesses 13 may correspondingly overlap (or be overlapped by) the first and second transfer gates TG1 and TG2. Portions of the first and second transfer gates TG1 and TG2 may extend into and fill the recesses 13. A gate dielectric layer Gox may be interposed between the substrate 1 and each of the first and second transfer gates TG1 and TG2. The gate dielectric layer Gox may be separated from the first and second photoelectric regions PD1 and PD2. The gate dielectric layer Gox may include a silicon oxide layer.

A gate capping pattern 15 may be disposed on a top surface of each of the first and second transfer gates TG1 and TG2. A gate spacer 17 may be on (e.g., may cover) a sidewall of each of the first and second transfer gates TG1 and TG2. The gate capping pattern 15 and the gate spacer 17 may be formed of, for example, a silicon nitride layer.

A first floating diffusion region FD1 may be disposed in the substrate 1 adjacent to the first transfer gate TG1, and a second floating diffusion region FD2 may be disposed in the substrate 1 adjacent to the second transfer gate TG2. The first and second floating diffusion regions FD1 and FD2 may be doped with impurities having an opposite conductivity type, such as N-type, to that of the impurities doped in the substrate 1. An ohmic layer 19 may be disposed on each of the first and second floating diffusion regions FD1 and FD2. The ohmic layer 19 may be formed of a metal silicide layer.

As shown in FIG. 1, on each of the first pixel areas UP1, a reset gate RG may be disposed on the first surface 1a of the substrate 1. The reset gate RG may be spaced apart from the first transfer gate TG1. Source/drain regions may be disposed in the substrate 1 adjacent to the reset gate RG. On each of the second pixel areas UP2, the first surface 1a of the substrate 1 may be provided thereon with a select gate SEL and a source follower gate SF that are spaced apart from each other. The select gate SEL and the source follower gate SF may be spaced apart from the second transfer gate TG2. Source/drain regions may be disposed in the substrate 1 adjacent to the select gate SEL and the source follower gate SF.

The gates TG1, TG2, RG, SEL, and SF may be covered with a plurality of interlayer dielectric layers 21. A lower-most one of the interlayer dielectric layers 21 may be provided therein with contact plugs 23 that are correspondingly electrically connected to the first and second floating diffusion regions FD1 and FD2. The interlayer dielectric layers 21 may include at least one of a silicon oxide layer, a silicon nitride layer, a silicon oxynitride layer, and a porous dielectric layer. The contact plugs 23 may be coupled to connection lines 25 between the interlayer dielectric layers 21. A passivation layer 30 may be disposed on the interlayer dielectric layers 21. The passivation layer 30 may include, for example, a silicon nitride layer.

The second surface 1b of the substrate 1 may contact a fixed charge layer 35. The fixed charge layer 35 may be formed of a metal oxide layer including oxygen whose amount (e.g., concentration) is less than its stoichiometric ratio or a metal fluoride layer including fluorine whose amount (e.g., concentration) is less than its stoichiometric ratio. The fixed charge layer 35 may have a negative fixed charge. The fixed charge layer 35 may include one of metal oxide and metal fluoride that include at least one metal selected from the group consisting of hafnium (Hf), zirconium (Zr), aluminum (Al), tantalum (Ta), titanium (Ti), yttrium (Y), and lanthanoid. The fixed charge layer 35 may be disposed on an edge of the deep pixel isolation section DTI and may be in contact with the substrate 1. In addition, the fixed charge layer 35 may extend to cover the second surface 1b of the substrate 1. The fixed charge layer 35 may suppress dark current and white spot issues.

Color filters CF may be disposed on the fixed charge layer 35. Micro-lenses ML may be disposed on respective color filters CF. The color filters CF may have, for example, one of red, green, and blue colors.

The substrate 1 may be provided therein with an amorphous region 7 adjacent to a sidewall of the deep pixel isolation section DTI. The amorphous region 7 may be spaced apart from the first and second photoelectric conversion sections PD1 and PD2. The amorphous region 7 may be doped with carbon ions and/or germanium ions. An electron suppress region 9 may be interposed between the amorphous region 7 and the sidewall of the deep pixel isolation section DTI. As used herein, the term "electron suppress" refers to electron suppression/blocking. The electron suppress region 9 may be doped with impurities having the same conductivity type as that of the impurities doped in the substrate 1. A concentration of the impurities doped in the electron suppress region 9 may be greater than that of the impurities doped in the substrate 1. For example, the electron suppress region 9 may be doped with boron ions. A concentration of boron doped in the electron suppress region 9 may be greater than that of boron doped in the substrate 1. The electron suppress region 9 may be additionally doped with carbon ions and/or germanium ions. The electron suppress region 9 may contact the sidewall of the deep pixel isolation section DTI or an inner/side wall of the deep pixel trench 5. The electron suppress region 9 and the amorphous region 7 may be uniformly distributed (e.g., may extend the same length in the direction Z, which intersects the directions X and Y), along the sidewall of the deep pixel isolation section DTI, from the second surface 1b of the substrate 1 to a bottom surface of the shallow device isolation section STI. In some embodiments, the electron suppress region 9 and the amorphous region 7 may be longer than the first photoelectric conversion section PD1 in the direction Z.

The first and second pixel areas UP1 and UP2 adjacent to each other in the second direction Y may share the reset gate RG, the source follower gate SF, and the select gate SEL. In some embodiments, a connection line and a contact plug may electrically connect the first and second floating diffusion regions FD1 and FD2 of the first and second pixel areas UP1 and UP2, respectively, adjacent to each other in the second direction Y. Charges created in the first and second pixel areas UP1 and UP2 may be sequentially transferred.

Referring to FIGS. 1 to 3, first, a power voltage may be applied to a drain of a reset transistor including the reset gate RG and a drain of a source follower transistor including the source follower gate SF, discharging charges remaining in the first and second floating diffusion regions FD1 and FD2. Afterwards, when the reset transistor is turned off and the first transfer gate TG1 is supplied with voltage, charges generated in the first photoelectric conversion section PD1 may be transferred to and accumulated in the first floating diffusion region FD1. A bias of the source follower gate SF may change in proportion to an amount of the accumulated charges, and this may bring about a variation in source potential of the source follower transistor. In this case, when a select transistor including the select gate SEL is turned on, a signal by/comprising charges may be read out of a signal readout line Vout. Thereafter, the same step/process may be performed on the second pixel area UP2.

An image sensor according to the present inventive concepts may include the electron suppress region 9 and the amorphous region 7 that are adjacent to the sidewall of the deep pixel isolation section DTI. The sidewall of the deep pixel isolation section DTI or the inner/side wall of the deep pixel trench 5 may have crystal defects or dangling bonds caused by etching damage. An annealing process may be performed to cure such crystal defects, but it may be difficult to obtain perfect recovery from the crystal defects. In addition, the annealing process may not completely remove the dangling bonds. The crystal defects or the dangling bonds may act as trap sites. When a photodiode creates photoelectrons from light in the presence of the trap sites, some of the photoelectrons may be caught by the trap sites and thus loss of light may occur. The dangling bonds may generate electrons and the generated electrons may flow into the photoelectric conversion sections PD1 and PD2, which may result in deterioration of dark current characteristics. Therefore, white spots may be produced under the dark state in the complete absence of light. However, boron ions doped in the electron suppress region 9 may block migration of electrons to suppress loss of light and to improve dark current characteristics.

FIGS. 4 to 8 illustrate cross-sectional views showing a method of fabricating an image sensor having the cross-section of FIG. 2.

Figure 4:
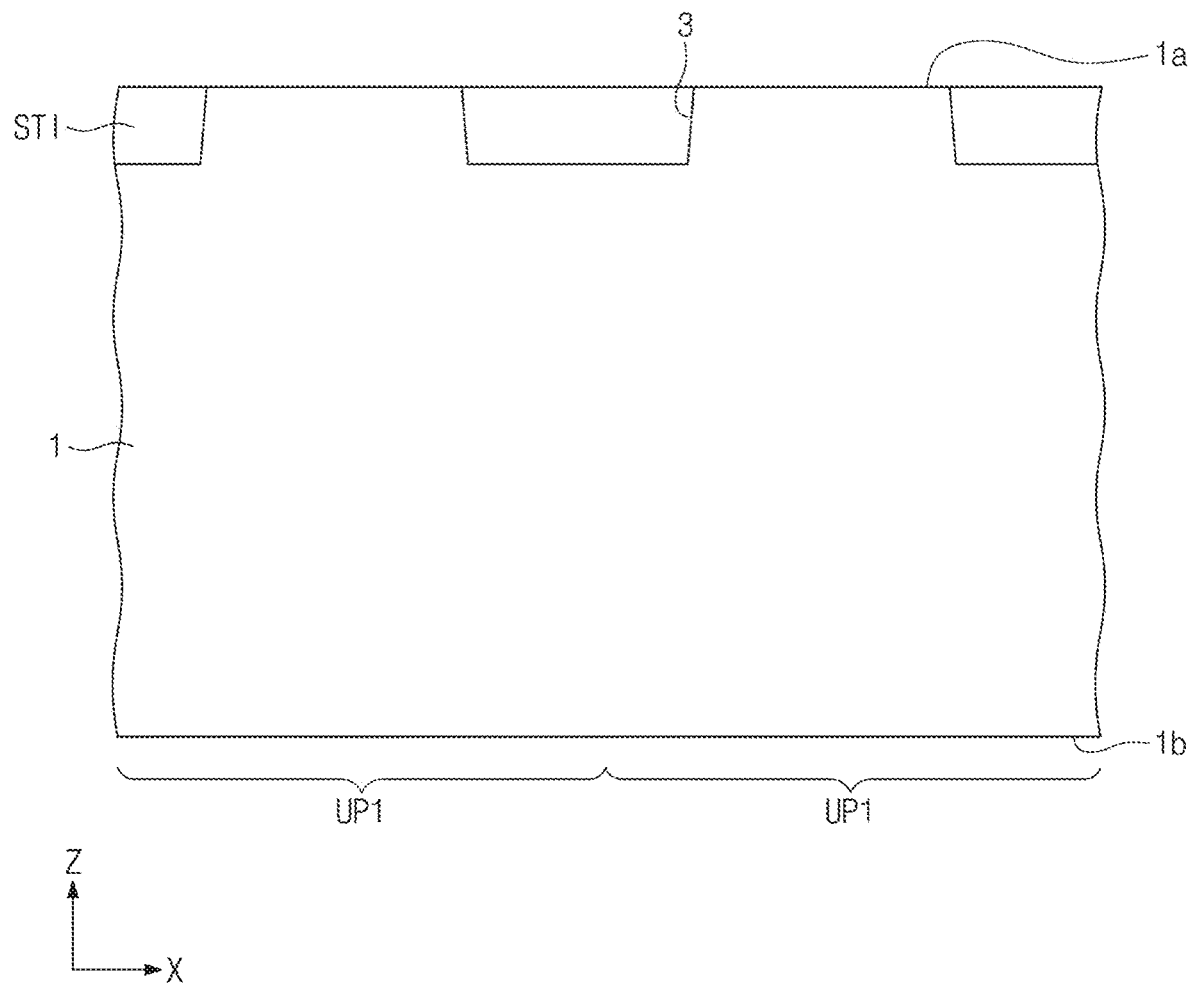
FIGS. 4 to 8 illustrate cross-sectional views showing a method of fabricating an image sensor having the cross-section of FIG. 2.

Referring to FIGS. 1 and 4, a substrate 1 may be prepared which includes a plurality of pixel areas UP1 and UP2. Shallow device trenches 3 may be formed by etching portions of the substrate 1 that are adjacent to a first surface 1a of the substrate 1. The shallow device trenches 3 may be filled with a dielectric layer and then a planarization process may be performed to form, in the shallow device trenches 3, shallow device isolation sections STI to define active regions of the substrate 1.

Figure 5:
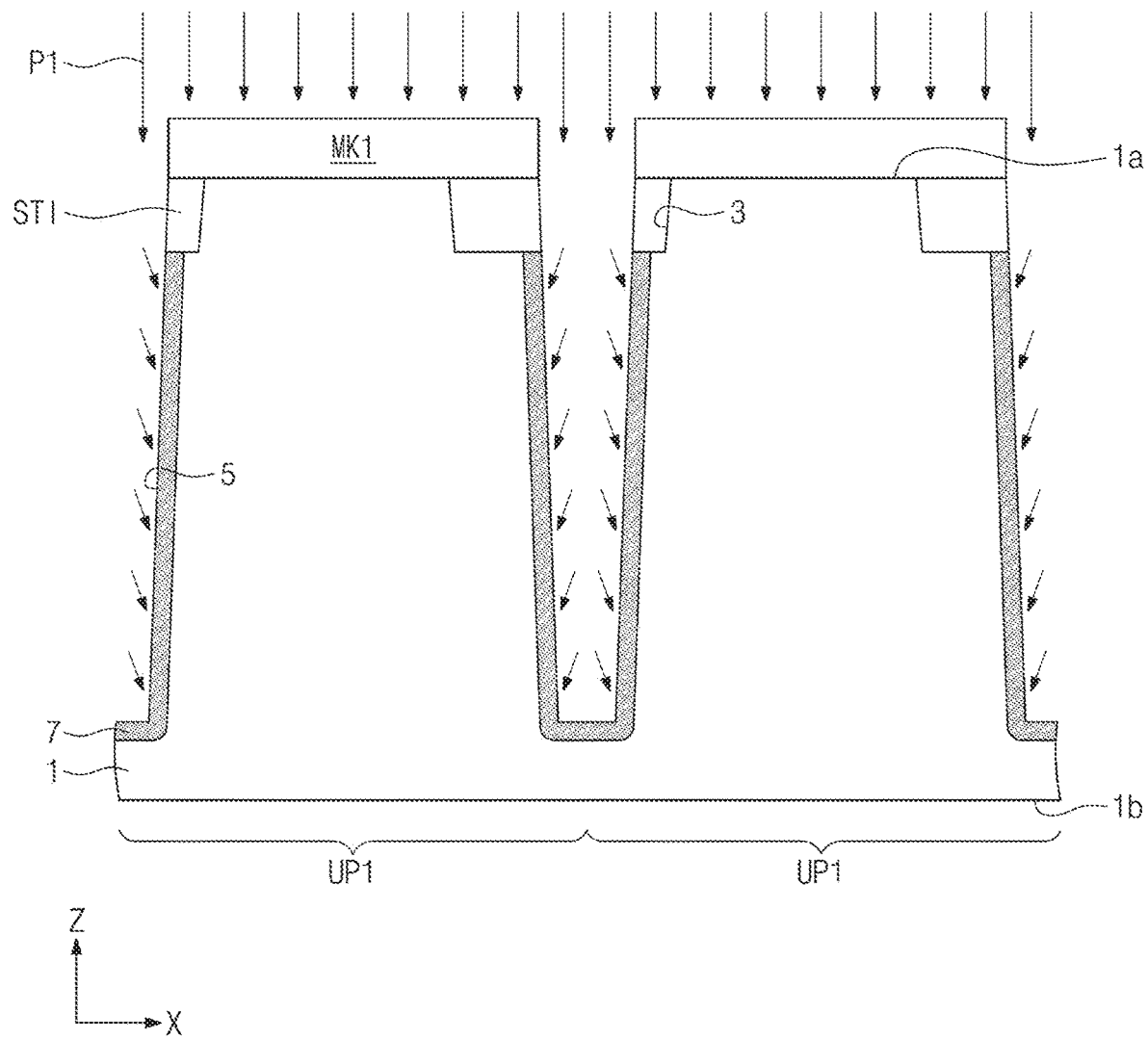

Referring to FIGS. 1 and 5, a first mask pattern MK1 may be formed on the first surface 1a of the substrate 1. The first mask pattern MK1 may be, for example, a photoresist pattern. The first mask pattern MK1 may have openings that define locations of deep pixel isolation sections DTI which will be discussed below with reference to FIG. 7. An etching process may be performed to form deep pixel trenches 5, in which process the first mask pattern MK1 is used as an etching mask to pattern a portion of the shallow device isolation section STI and the substrate 1. The etching process may cause etching damage (in one or more locations) on an inner/side wall of the deep pixel trench 5, and the etching damage may produce crystal defects or dangling bonds. The deep pixel trench 5 may be formed to have a bottom surface spaced apart from a second surface 1b of the substrate 1.

A first plasma doping process P1 may be performed to form an amorphous region 7 on a portion of the substrate 1 adjacent to (and/or defining) the bottom surface and the inner/side wall of the deep pixel trench 5. The first plasma doping process P1 may implant the amorphous region 7 with carbon ions and/or germanium ions to change the portion of the substrate 1 from a crystalline structure into an amorphous structure. At least one of methane and ethane may be provided as a source material to implant the carbon ions. Alternatively, a germanium source material may be provided to implant the germanium ions. A process chamber may receive these source materials in a gaseous state. When a high voltage bias is applied to an electrostatic chuck on which the substrate 1 is loaded after this source material is plasma-ionized, carbon cations or germanium cations of plasma may be accelerated and implanted into the substrate 1. The plasma doping may achieve a uniform doping even at extremely deep locations and may increase doping speeds. Because the deep pixel trench 5 is relatively narrower and deeper than the shallow device trench 3, it may be difficult or impossible for a beam line ion implantation process to uniformly form the amorphous region 7 along its depth. The amorphous region 7 may be formed to have a bottom surface spaced apart from the second surface 1b of the substrate 1.

Figure 6:
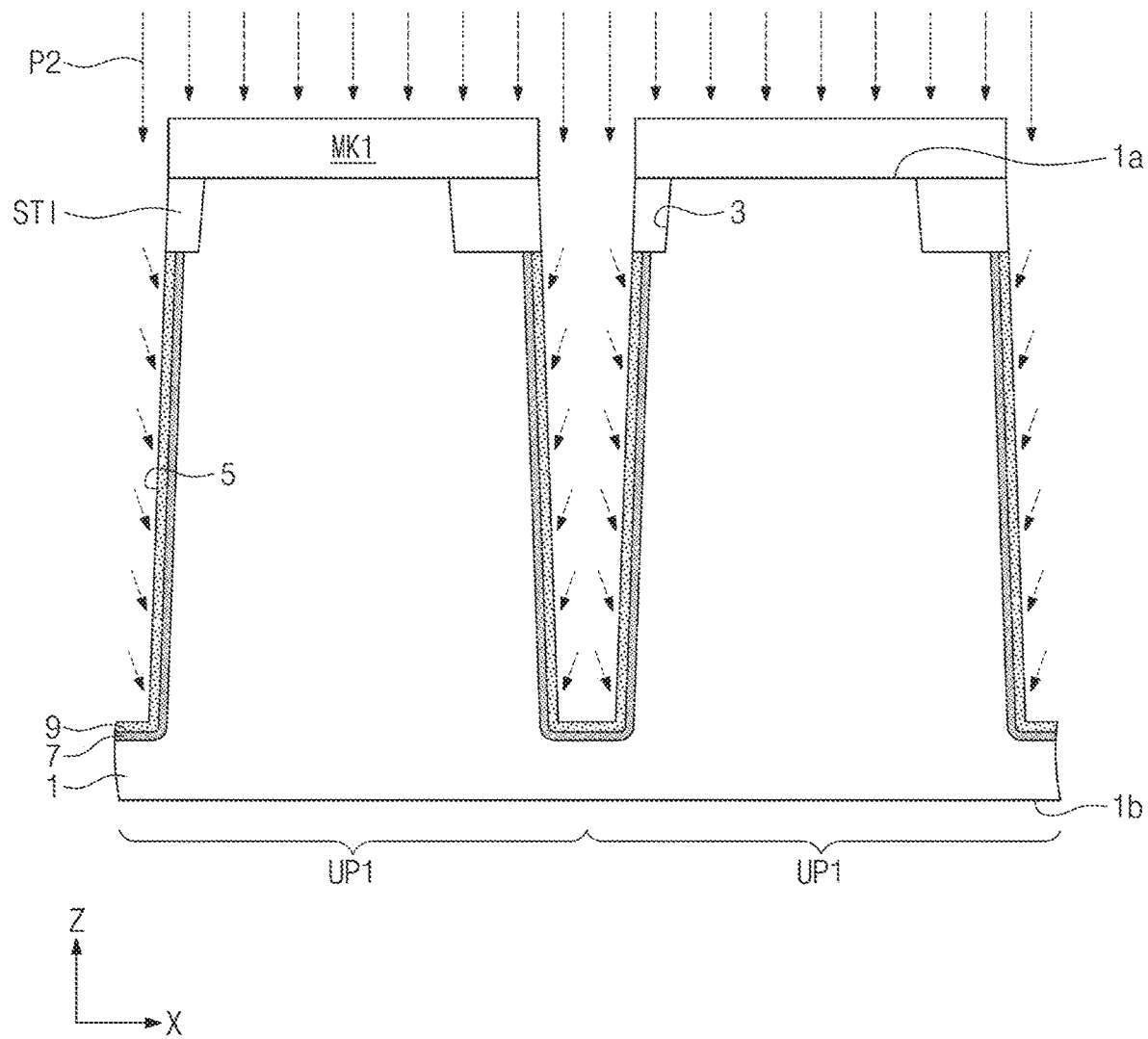

Referring to FIGS. 1 and 6, the substrate 1 having the amorphous region 7 formed therein may undergo a second plasma doping process P2 to form an electron suppress region 9 on a portion of the amorphous region 7. For example, the second plasma doping process P2 may implant the amorphous region 7 with boron ions to form the electron suppress region 9. At least one of $BF_3$ and $B_2H_6$ may be provided as a source material to implant the boron ions. A process chamber may receive this source material in a gaseous state. When a high voltage bias is applied to an electrostatic chuck on which the substrate 1 is loaded after this source material is plasma-ionized, boron cations of plasma may be accelerated and implanted into the substrate 1. In comparison with a beam line ion implantation process, the plasma doping process may achieve a uniform doping even at extremely deep locations and may increase doping speeds. Because the electron suppress region 9 is formed on the portion of the amorphous region 7, the electron suppress region 9 may also be doped with carbon ions and/or germanium ions implanted in the amorphous region 7.

Figure 7:
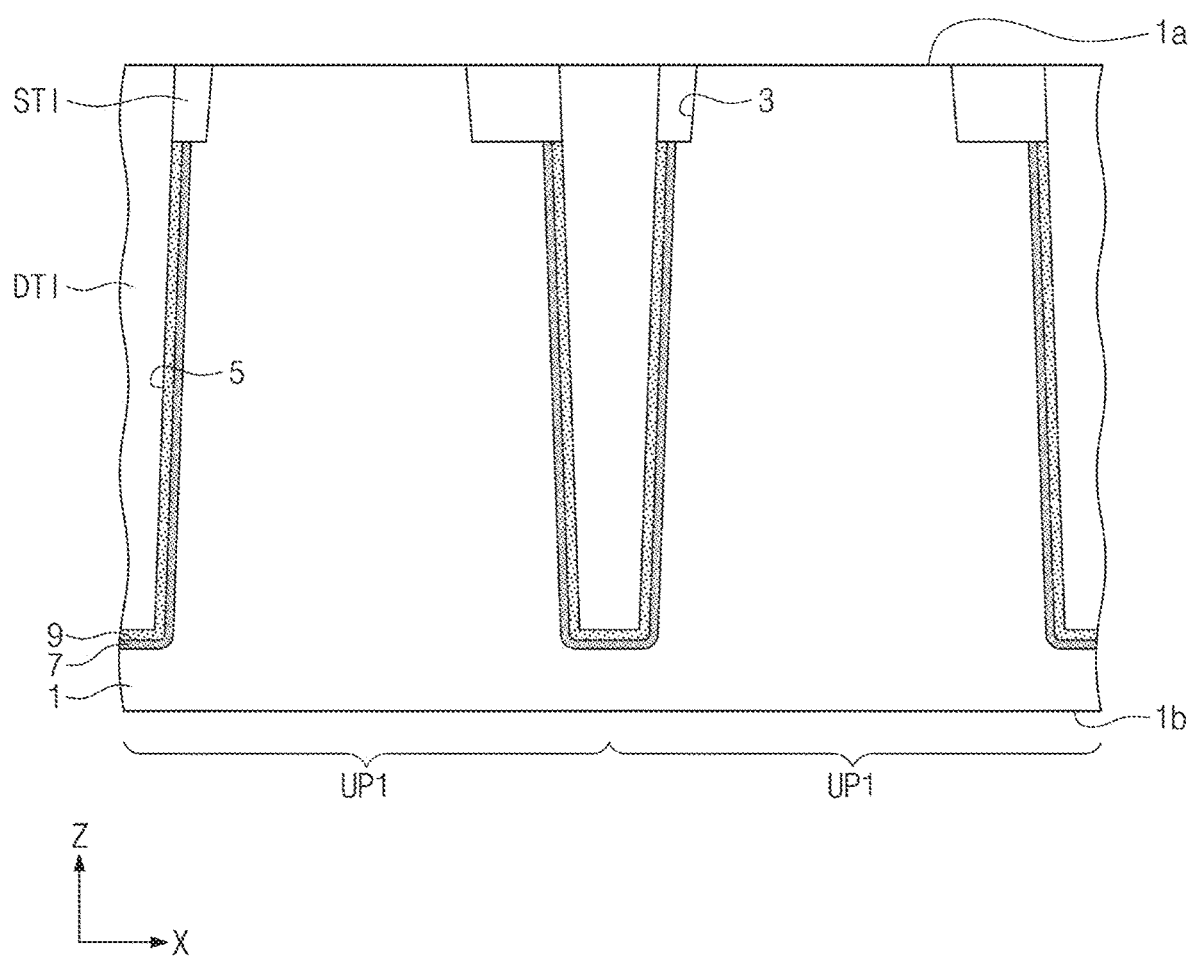

Referring to FIG. 7, the first mask pattern MK1 may be removed to expose the first surface 1a of the substrate 1. When the first mask pattern MK1 is formed of a photoresist pattern, an ashing process may be executed to remove the first mask pattern MK1. An annealing process may be performed. The annealing process may be performed at a temperature of about 1,000° C. or higher. The annealing process may recover/repair the crystal defects caused by the etching damage on the inner/side wall of the deep pixel trench 5. When the amorphous region 7 is absent, the boron ions doped in the electron suppress region 9 may diffuse into the substrate 1. When the boron ions doped in the electron suppress region 9 diffuse close to conversion regions PD1 and PD2 which will be discussed below with reference to FIGS. 1 and 8, depletion regions of PN junctions may be affected to reduce full well capacitance (FWC) characteristics, which may result in a decrease in photosensitivity. However, according to the present inventive concepts, the amorphous region 7 may have an amorphous crystal structure to block/prevent/suppress the diffusion of the boron ions. The amorphous region 7 may serve as a diffusion break layer to impede/prevent the boron ions from diffusing from the electron suppress region 9. It may thus be possible to inhibit deterioration of FWC characteristics and to improve photosensitivity.

A dielectric layer may be stacked on an entire surface (e.g., the entire surface 1a) of the substrate 1, and a planarization process may be performed to form a deep pixel isolation section DTI in the deep pixel trench 5.

Though the discussion herein with respect to FIG. 7 describes an example in which the annealing process is followed by the formation of the deep pixel isolation section DTI, the annealing process may instead be preceded by the formation of the deep pixel isolation section DTI.

Figure 8:
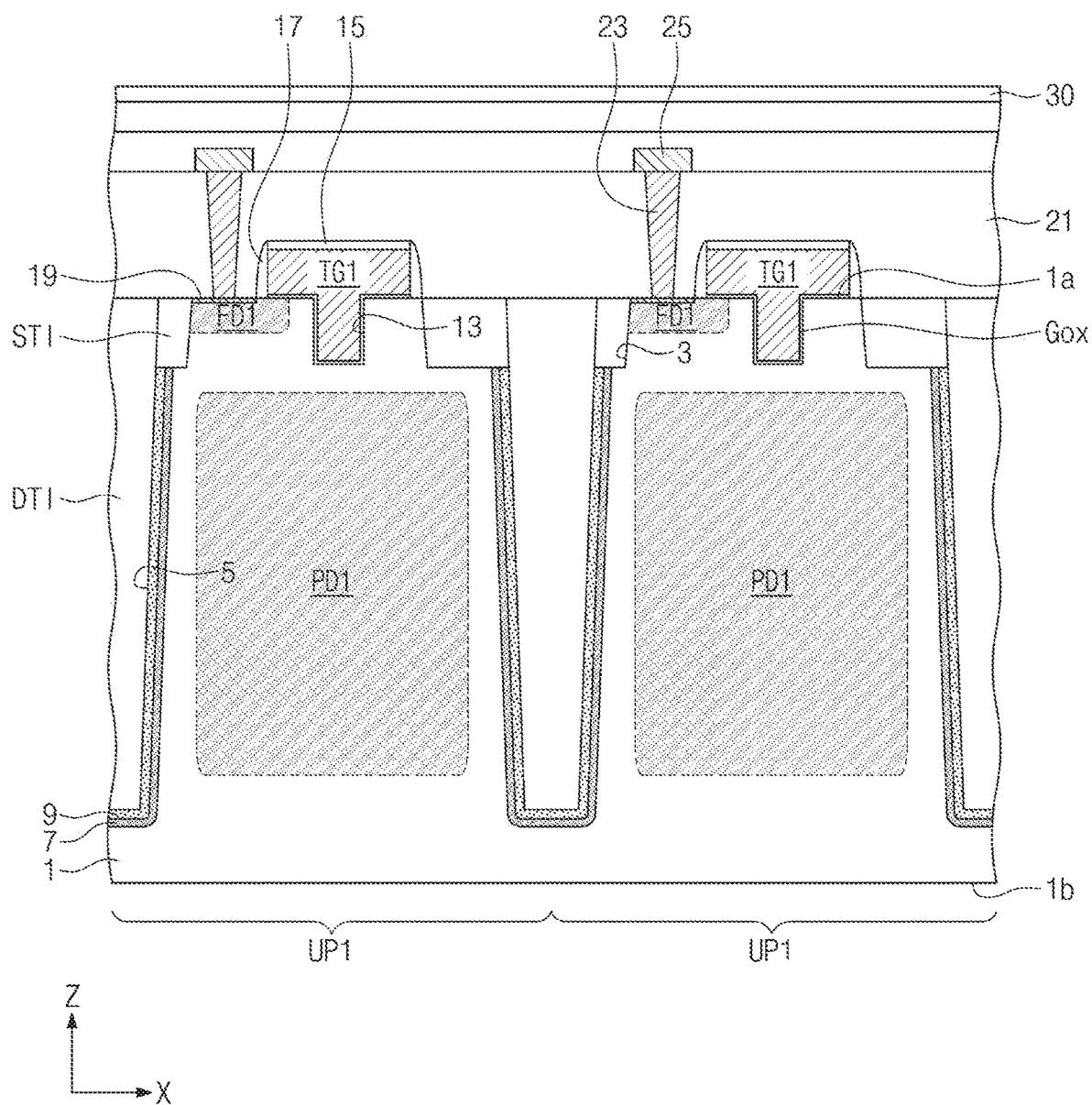

Referring to FIGS. 1 and 8, an ion implantation process may be performed to dope the substrate 1 with impurities having an opposite conductivity type to that of impurities doped in the substrate 1, and thus first and second photoelectric regions PD1 and PD2 may be formed in the substrate 1 on the first and second pixel areas UP1 and UP2, respectively. The first and second photoelectric conversion sections PD1 and PD2 may be formed before or after forming the shallow device isolation section STI of FIG. 4. The first surface 1a of the substrate 1 may be partially etched to form recesses 13. A thermal oxidation process may be performed to form a gate dielectric layer Gox on the first surface 1a of the substrate 1. A conductive layer and a capping layer may be stacked on the first surface 1a of the substrate 1, and then patterned to form first and second transfer gates TG1 and TG2, reset gates RG, select gates SEL, source follower gates SF, and gate capping patterns 15. A spacer layer may be conformally stacked on the first surface 1a of the substrate 1, and then anisotropically etched to form gate spacers 17 covering sidewalls of the first and second transfer gates TG1 and TG2, of the reset gates RG, of the select gates SEL, of the source follower gates SF, and of the gate capping patterns 15.

An ion implantation process may be performed to form first and second floating diffusion regions FD1 and FD2 in the substrate 1 adjacent to the first and second transfer gates TG1 and TG2, respectively. In this step, source/drain regions may be formed in the substrate 1 adjacent to the reset gate RG, the select gates SEL, and the source follower gate SF. A silicidation process may be performed to form an ohmic layer 19 on the first surface 1a of the substrate 1, which first surface 1a is exposed. Interlayer dielectric layers 21, contact plugs 23, connection lines 25, and a passivation layer 30 may be formed on the first surface 1a of the substrate 1.

Referring to FIGS. 1 and 2, a grinding process may be performed to partially remove the second surface 1b of the substrate 1, exposing a bottom surface of the deep pixel isolation section DTI. The grinding process may also remove portions of the amorphous region 7 and the electron suppress region 9 that are adjacent to the bottom surface of the deep pixel trench 5. A fixed charge layer 35 may be formed on the second surface 1b of the substrate 1. Color filters CF and micro-lenses ML may be sequentially formed on the fixed charge layer 35.

Figure 9:
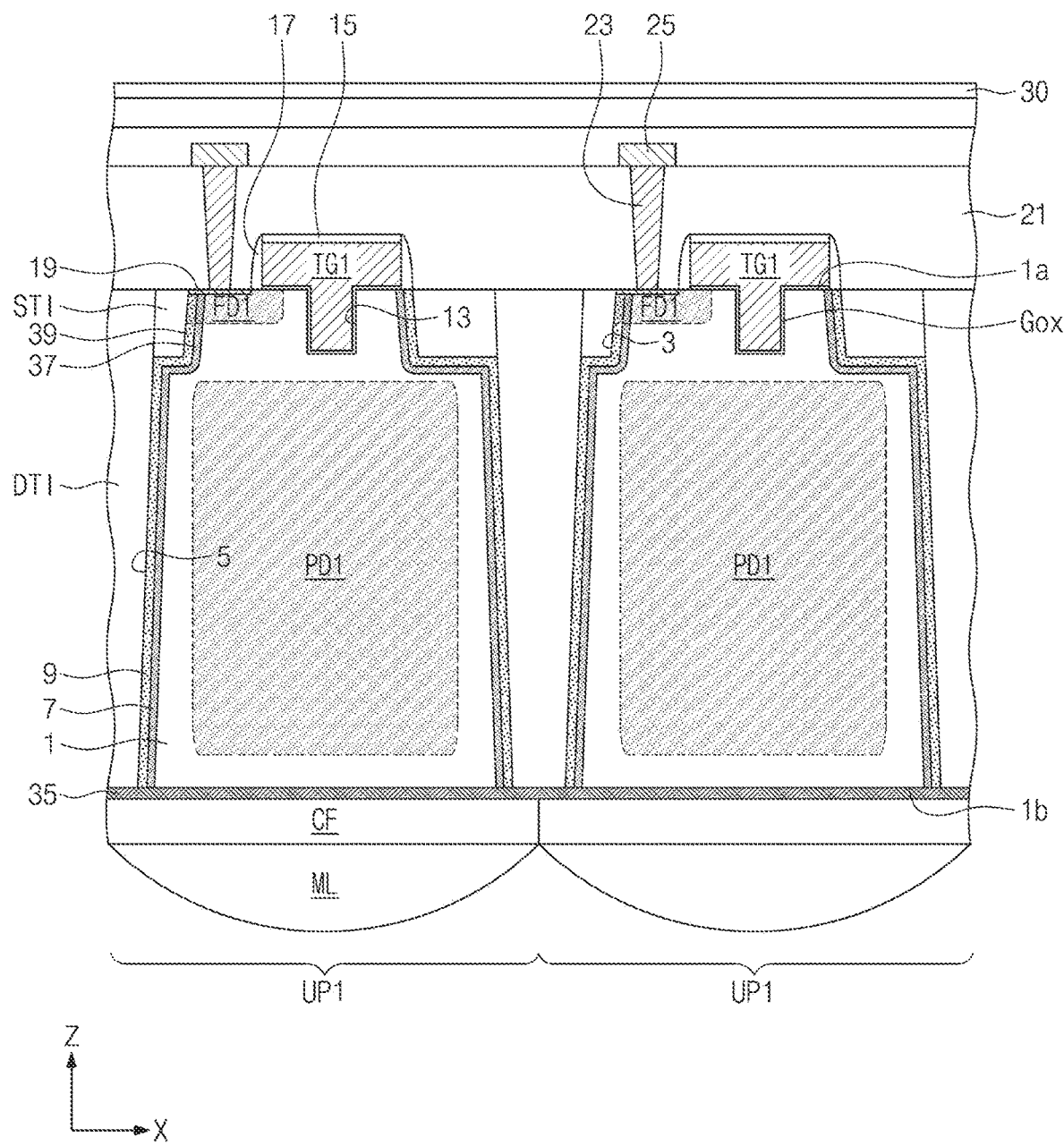
FIG. 9 illustrates a cross-sectional view taken along line I-I' of FIG. 1.

FIG. 9 illustrates a cross-sectional view taken along line I-I' of FIG. 1.

Referring to FIG. 9, an image sensor according to some embodiments may be configured such that a first amorphous region 7 may be disposed in the substrate 1 adjacent to a sidewall of the deep pixel isolation section DTI. A first electron suppress region 9 may be interposed between the amorphous region 7 and the sidewall of the deep pixel isolation section DTI. A second amorphous region 37 may be disposed in the substrate 1 adjacent to a sidewall of the shallow device isolation section STI. A second electron suppress region 39 may be interposed between the amorphous region 37 and the sidewall of the shallow device isolation section STI. The second amorphous region 37 and the second electron suppress region 39 may be adjacent to a bottom surface of the shallow device isolation section STI. The second electron suppress region 39 may contact the sidewall and the bottom surface of the shallow device isolation section STI. The first and second electron suppress regions 9 and 39 may all be doped with impurities the same as those doped in the substrate 1, and may have impurity concentrations greater than that of the substrate 1. For example, the first and second electron suppress regions 9 and 39 may be doped with boron ions. The first and second electron suppress regions 9 and 39 may be additionally doped with carbon ions and/or germanium ions. The first and second amorphous regions 7 and 37 may be doped with carbon ions and/or germanium ions.

The second amorphous region 37 and the second electron suppress region 39 may extend into the first and second floating diffusion regions FD1 and FD2. Thus, each of the first and second floating diffusion regions FD1 and FD2 may include a portion, of the second amorphous region 37, doped with carbon ions and/or germanium ions. Other configurations of the image sensor shown in FIG. 9 may be identical or similar to those discussed with reference to FIGS. 1 and 2.

The image sensor shown in FIG. 9 may be configured such that the deep pixel isolation section DTI has a sidewall that is adjacent the first electron suppress region 9 to suppress migration of electrons, and that the shallow device isolation section STI has a sidewall that is adjacent the second electron suppress region 39 to suppress migration of electrons. As such, the image sensor may successfully impede/prevent loss of light and may satisfactorily improve dark current characteristics. The first and second amorphous regions 7 and 37 may restrain diffusion of boron ions doped in the first and second electron suppress regions 9 and 39.

Figure 10:
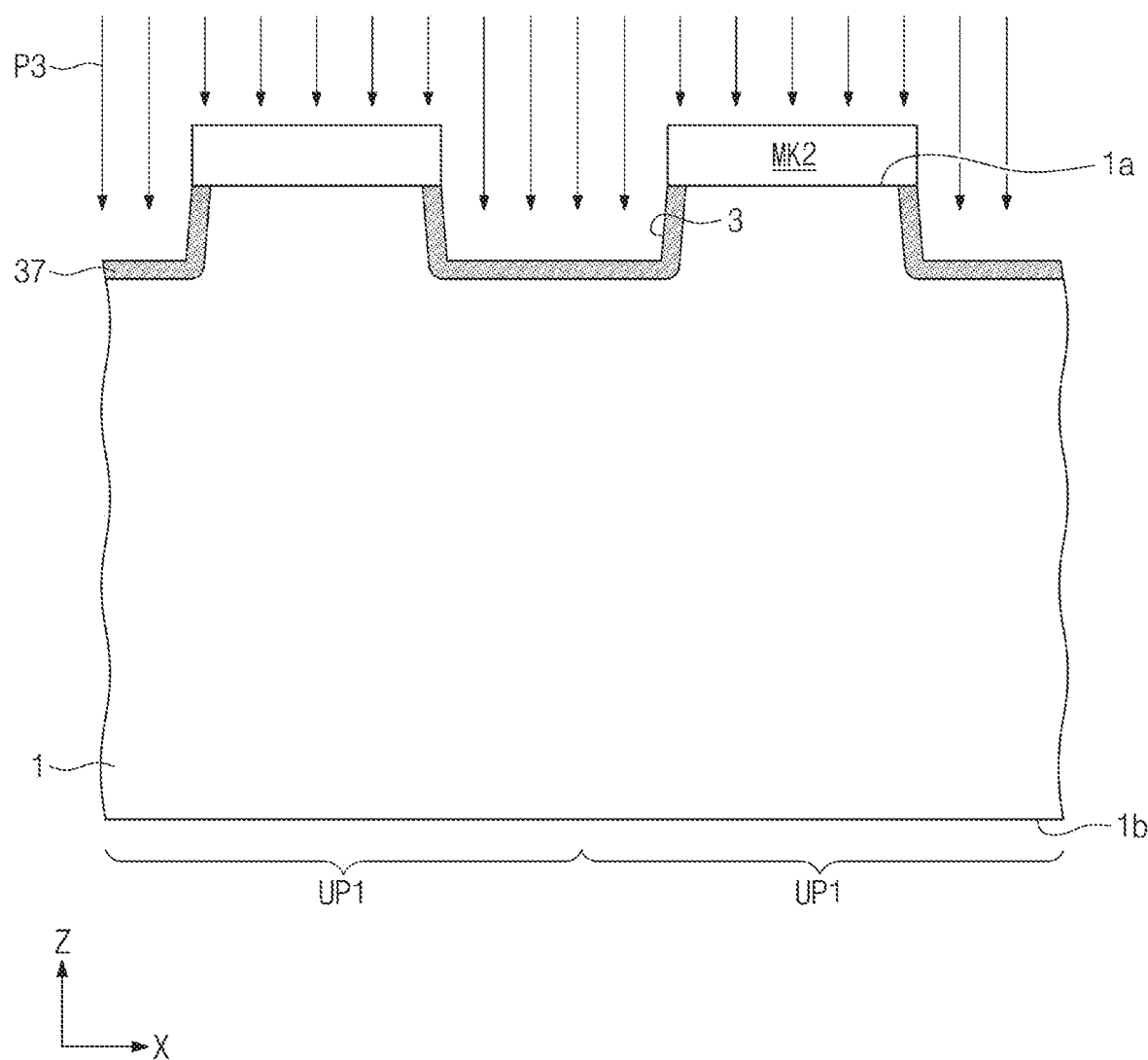
FIGS. 10 to 12 illustrate cross-sectional views showing a method of fabricating an image sensor having the cross-section of FIG. 9.
Figure 11:
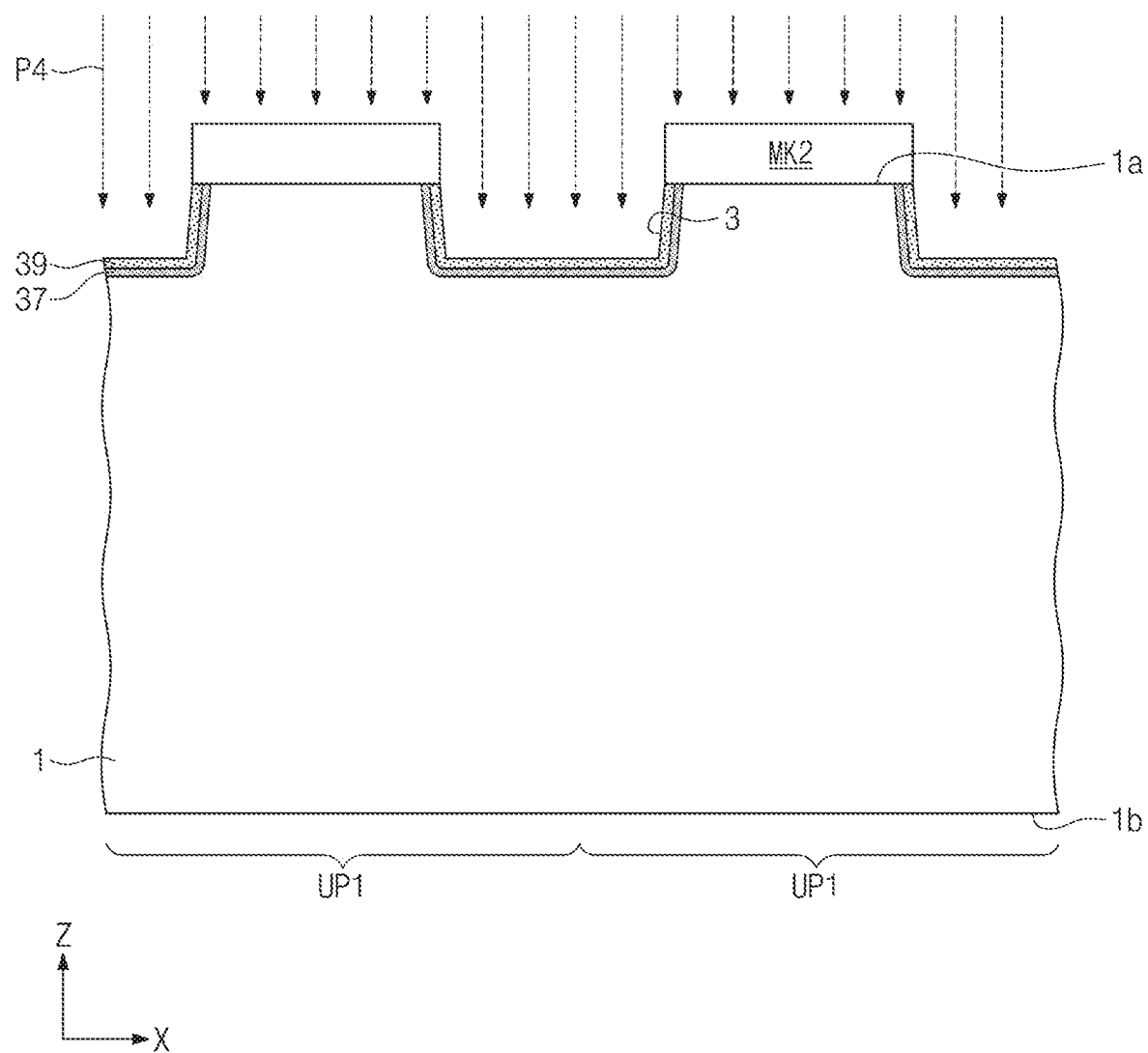
Figure 12:
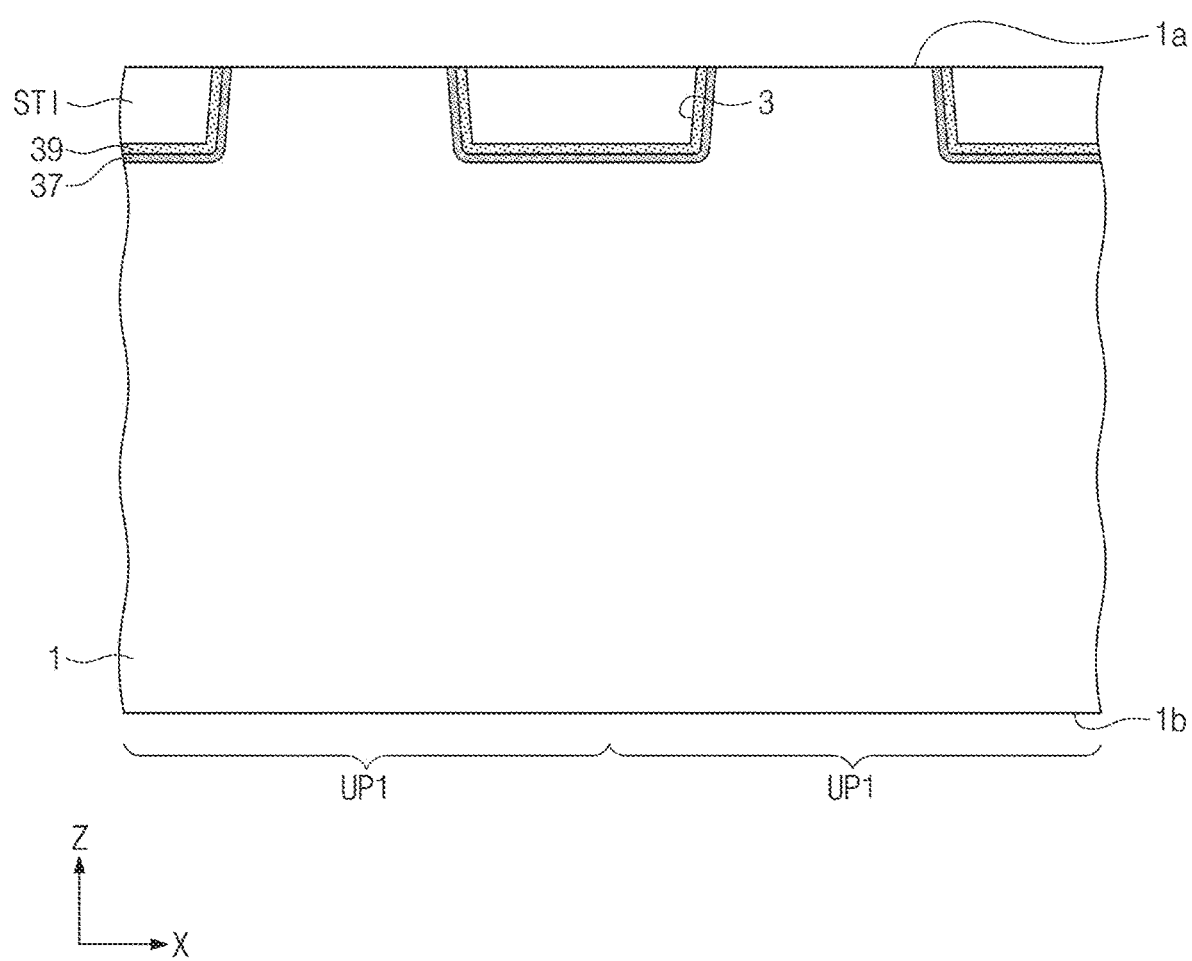

FIGS. 10 to 12 illustrate cross-sectional views showing a method of fabricating an image sensor having the cross-section of FIG. 9.

Referring to FIGS. 1 and 10, a second mask pattern MK2 may be formed, on the first surface 1a of the substrate 1, to have an opening that defines a position of the shallow device isolation section STI. The second mask pattern M2 may be formed of, for example, a photoresist pattern. The shallow device trench 3 may be formed by an etching process in which the second mask pattern MK2 is used as an etching mask to partially etch the first surface 1a of the substrate 1. A first process P3 may be performed to form the second amorphous region 37 on a portion of the substrate 1, which portion is adjacent to the sidewall and the bottom surface of the shallow device trench 3. The first process P3 may be a plasma doping process or a beam line ion implantation process. The second amorphous region 37 may be doped with carbon ions and/or germanium ions. When the second amorphous region 37 is doped with carbon ions, at least one of methane and ethane may be supplied as a source material.

Referring to FIG. 11, a second process P4 may be performed to form the second electron suppress region 39 in a portion of the second amorphous region 37. The second process P4 may be a plasma doping process or a beam line ion implantation process. The second electron suppress region 39 may be doped with boron ions. At least one of $BF_3$ and $B_2H_6$ may be supplied as a source material to form the second electron suppress region 39.

Referring to FIG. 12, the shallow device trench 3 may be filled with a single or multiple dielectric layers including at least one selected from a silicon oxide layer, a silicon nitride layer, and a silicon oxynitride layer, and then a planarization process may be performed to form the shallow device isolation section STI.

The processes discussed with reference to FIGS. 5 to 8 may be subsequently performed. After the formation of the second electron suppress region 39 or the shallow device isolation section STI, an annealing process may be performed to recover/repair etching damage on the inner/side wall of the shallow device trench 3. Alternatively, after the formation of the first electron suppress region 9 or the deep pixel isolation section DTI, the annealing process may be performed to recover/repair etching damage on the inner/side walls of the shallow device trench 3 and the deep pixel trench 5.

Figure 13:
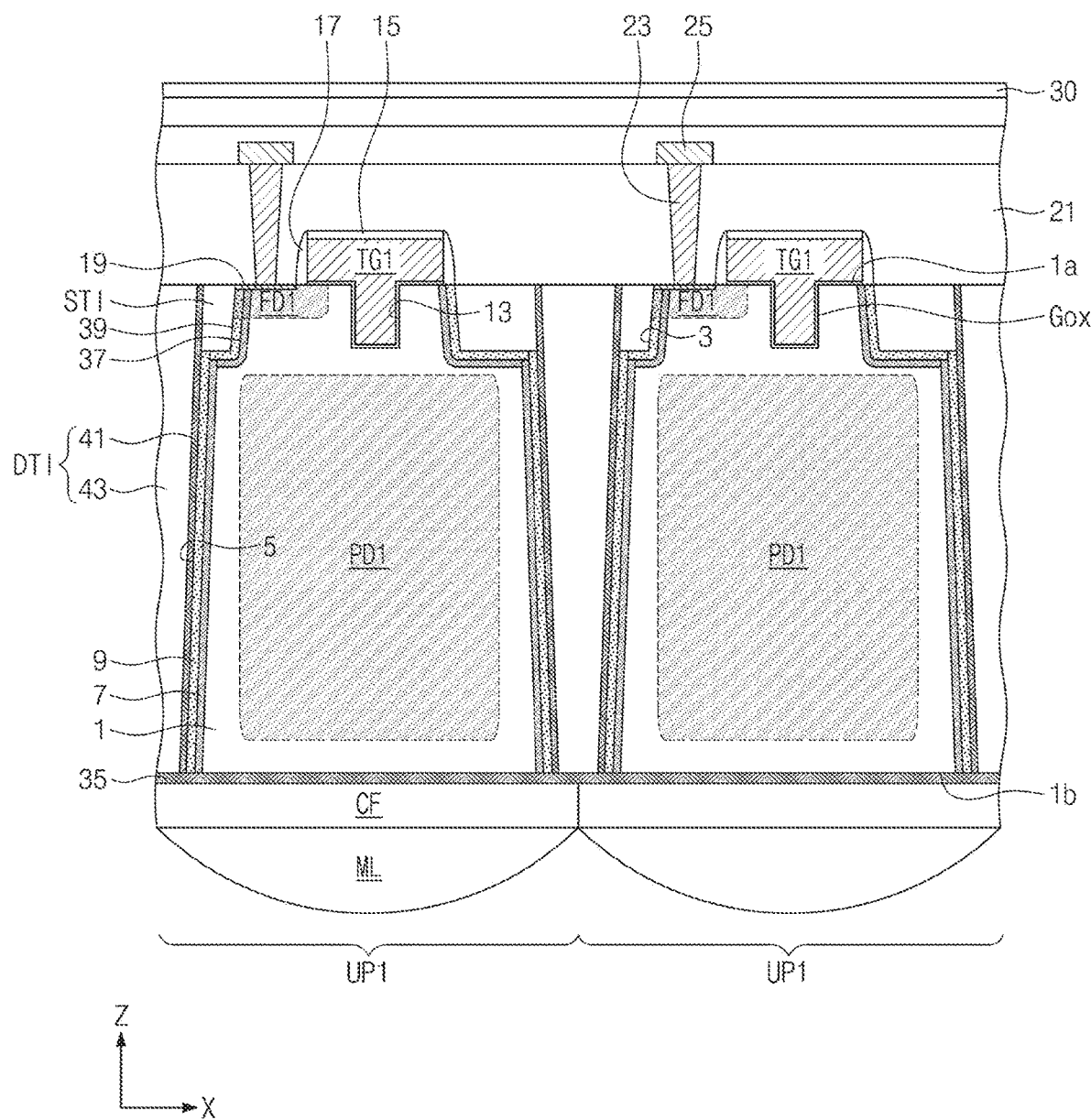
FIG. 13 illustrates a cross-sectional view taken along line I-I' of FIG. 1.

FIG. 13 illustrates a cross-sectional view taken along line I-I' of FIG. 1.

Referring to FIG. 13, an image sensor according to some embodiments may be configured such that the deep pixel isolation section DTI may include a first fixed charge layer 41 and a buried dielectric layer 43. The first fixed charge layer 41 may contact the electron suppress region 9. The first fixed charge layer 41 may be interposed between the buried dielectric layer 43 and the shallow device isolation section STI. The second surface 1b of the substrate 1 may contact a second fixed charge layer 35. The first and second fixed charge layers 41 and 35 may consist of a metal oxide layer including oxygen whose amount (e.g., concentration) is less than its stoichiometric ratio or a metal fluoride layer including fluorine whose amount (e.g., concentration) is less than its stoichiometric ratio. The buried dielectric layer 43 may be formed of a single or multiple layer including at least one of a silicon oxide layer, a silicon nitride layer, and a silicon oxynitride layer. Other configurations of the image sensor shown in FIG. 13 may be identical or similar to those of the image sensor discussed above with reference to FIG. 9.

The image sensor of FIG. 13 may be fabricated by, when the deep pixel isolation section DTI is formed in a step/process shown in FIG. 7, conformally forming the first fixed charge layer 41 on the inner/side wall and the bottom surface of the deep pixel trench 5, filling the deep pixel trench 5 with the buried dielectric layer 43, and then performing a planarization process.

Figure 14:
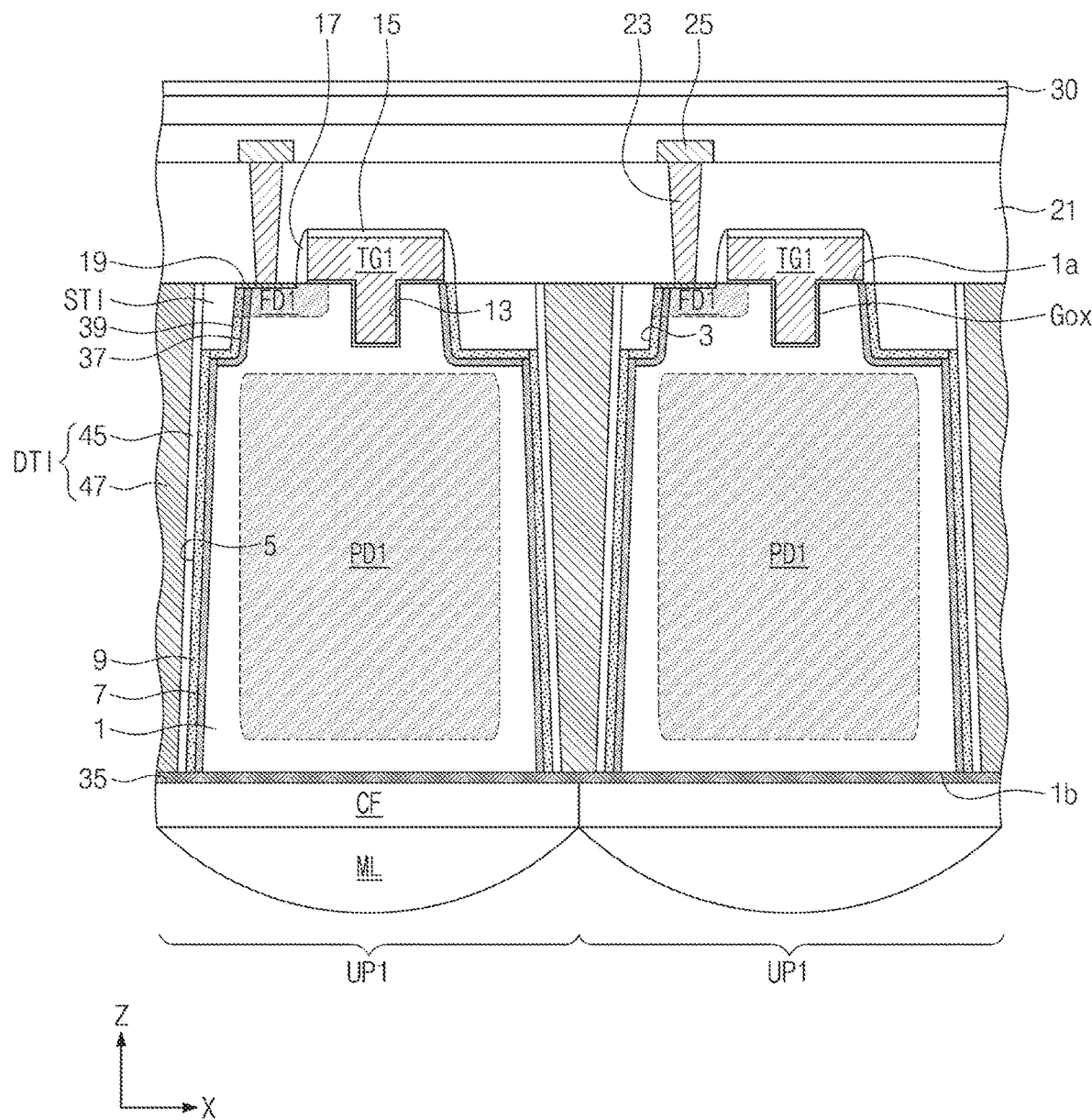
FIG. 14 illustrates a cross-sectional view taken along line I-I' of FIG. 1.

FIG. 14 illustrates a cross-sectional view taken along line I-I' of FIG. 1.

Referring to FIG. 14, an image sensor according to some embodiments may be configured such that the deep pixel isolation section DTI may include a dielectric liner 45 conformally covering the inner/side wall and the bottom surface of the deep pixel trench 5 and also include a conductive pattern 47 filing the deep pixel trench 5. The dielectric liner 45 may contact the first electron suppress region 9. The dielectric liner 45 may be interposed between the conductive pattern 47 and the shallow device isolation section STI. The dielectric liner 45 may have a single-layered or multi-layered structure including at least one of a silicon oxide layer, a silicon nitride layer, and a silicon oxynitride layer. The conductive pattern 47 may include an impurity-doped polysilicon pattern or a metal-containing layer. The conductive pattern 47 may be used as a common bias line. The conductive pattern 47 may be supplied with a negative voltage. Thus, dark current characteristics may be improved due to holding of holes (or positive charges) possibly present on a surface of the deep pixel isolation section DTI. Other configurations and fabrication processes of the image sensor shown in FIG. 14 may be identical or similar to those of the image sensor discussed with reference to FIG. 13.

Figure 15:
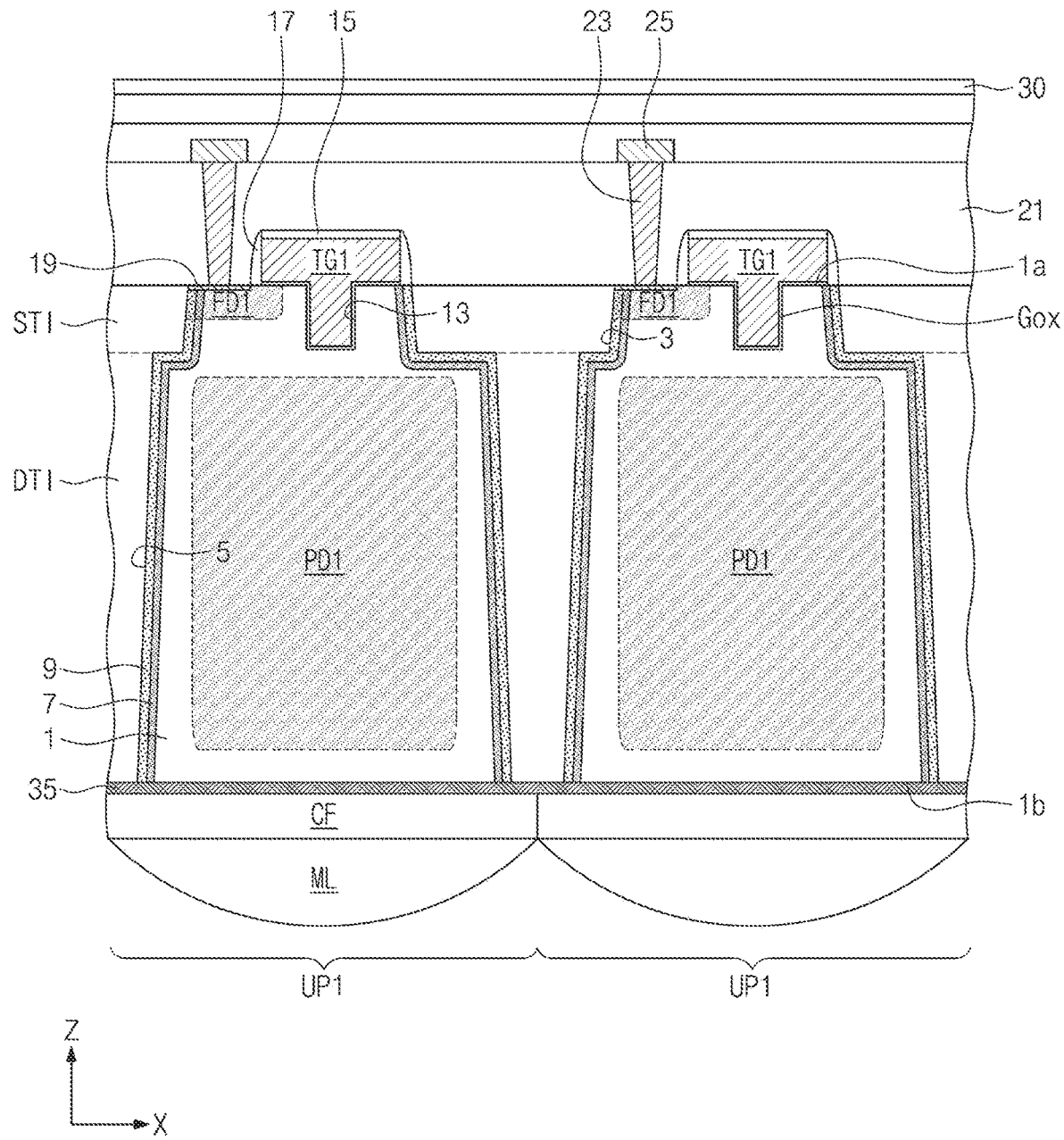
FIG. 15 illustrates a cross-sectional view taken along line I-I' of FIG. 1.

FIG. 15 illustrates a cross-sectional view taken along line I-I' of FIG. 1.

Referring to FIG. 15, an image sensor according to some embodiments may be configured such that the shallow device isolation section STI and the deep pixel isolation section DTI may be collectively connected into a single structure. The shallow device trench 3 and the deep pixel trench 5 may be collectively shaped like a dual damascene hole structure. The amorphous region 7 may be disposed in the substrate 1 adjacent to the sidewall of the deep pixel isolation section DTI and to the sidewall and the bottom surface of the shallow device isolation section STI. The electron suppress region 9 may be interposed between the amorphous region 7 and the sidewall of the deep pixel isolation section DTI, between the amorphous region 7 and the sidewall of the shallow device isolation section STI, and between the amorphous region 7 and the bottom surface of the shallow device isolation section STI. The amorphous region 7 and the electron suppress region 9 may extend into the first and second floating diffusion regions FD1 and FD2. Thus, each of the first and second floating diffusion regions FD1 and FD2 may have a portion doped with carbon ions and/or germanium ions.

Figure 16:
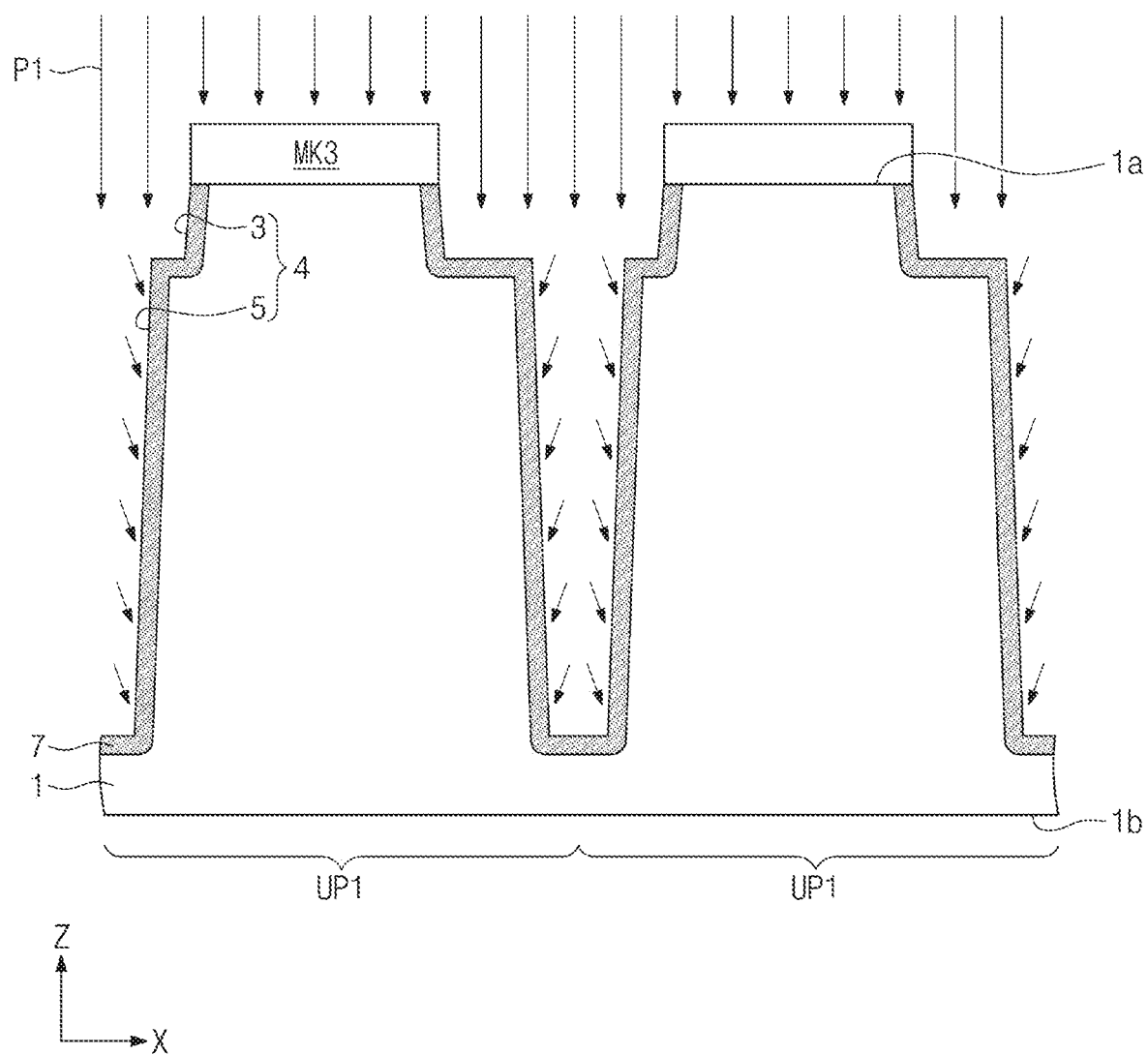
FIGS. 16 and 17 illustrate cross-sectional views showing a method of fabricating an image sensor having the cross-section of FIG. 15.
Figure 17:
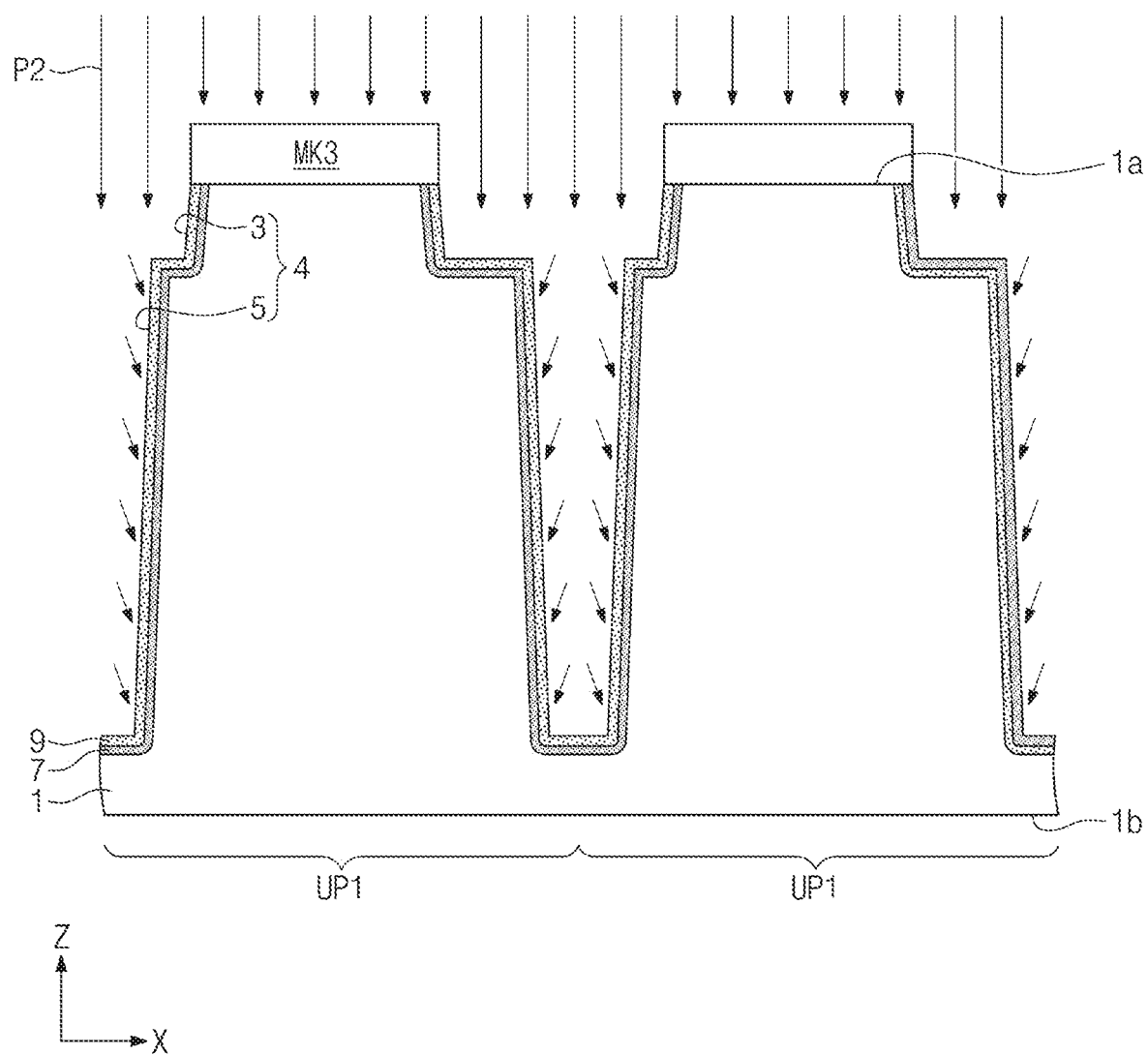

FIGS. 16 and 17 illustrate cross-sectional views showing a method of fabricating an image sensor having the cross-section of FIG. 15.

Referring to FIGS. 1 and 16, a third mask pattern MK3 and a subsidiary mask pattern may be used to etch the substrate 1 several times to form a dual trench 4 including the shallow device trench 3 and the deep pixel trench 5. As used herein, the term "subsidiary" refers to an additional/auxiliary pattern or region. A first plasma doping process P1 may be performed to form the amorphous region 7 on a portion of the substrate 1 adjacent to (and/or defining) an inner/side wall and a bottom surface of the dual trench 4. The amorphous region 7 may be doped with carbon ions and/or germanium ions. At least one of methane and ethane may be provided as a source material to implant the carbon ions. Alternatively, a germanium source material may be provided to implant the germanium ions.

Referring to FIG. 17, a second plasma doping process P2 may be performed to form the electron suppress region 9 on a portion of the substrate 1 adjacent to (and/or defining) the inner/side wall and the bottom surface of the dual trench 4. The electron suppress region 9 may have a doping depth less than that of the amorphous region 7. The electron suppress region 9 may be doped with boron ions. At least one of $BF_3$ and $B_2H_6$ may be provided as a source material to implant the boron ions.

Subsequently, referring to FIG. 15, the third mask pattern MK3 may be removed to expose the first surface 1a of the substrate 1. The dual trench 4 may be filled with a dielectric layer stacked on the first surface 1a of the substrate 1, and then a planarization process may be performed to form the shallow device isolation section STI and the deep pixel isolation section DTI at the same time in the dual trench 4. In some embodiments, the first and second plasma doping processes P1 and P2 may form the amorphous region 7 and the electron suppress region 9 to have uniform depths (i.e., lengths in the direction Z) even in the substrate 1 having the dual trench 4 whose structure is relatively complicated. As such, it may be possible to further simplify fabrication processes.

Figure 18:
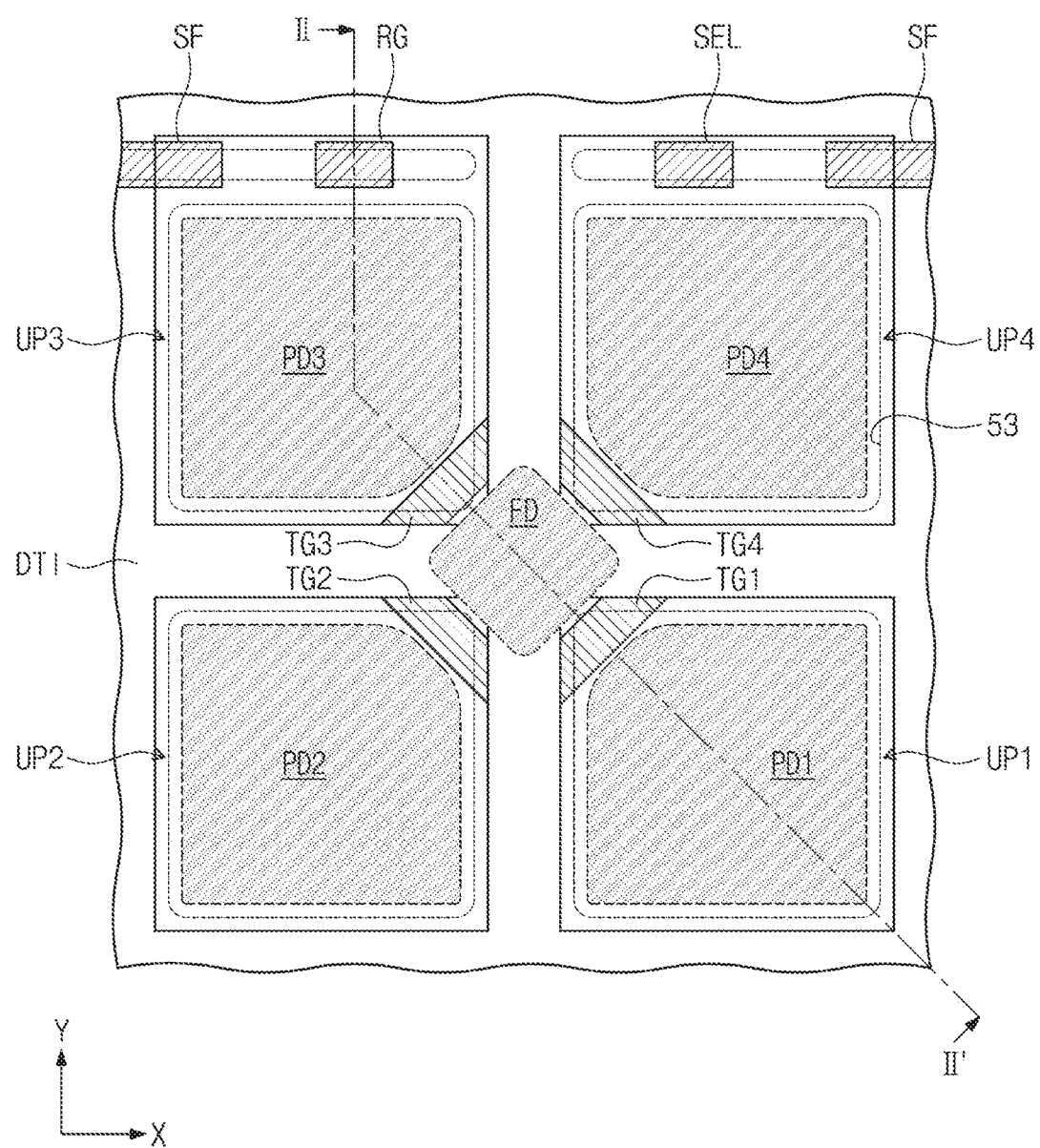
FIG. 18 illustrates a plan view showing an image sensor according to some example embodiments of the present inventive concepts.
Figure 19:
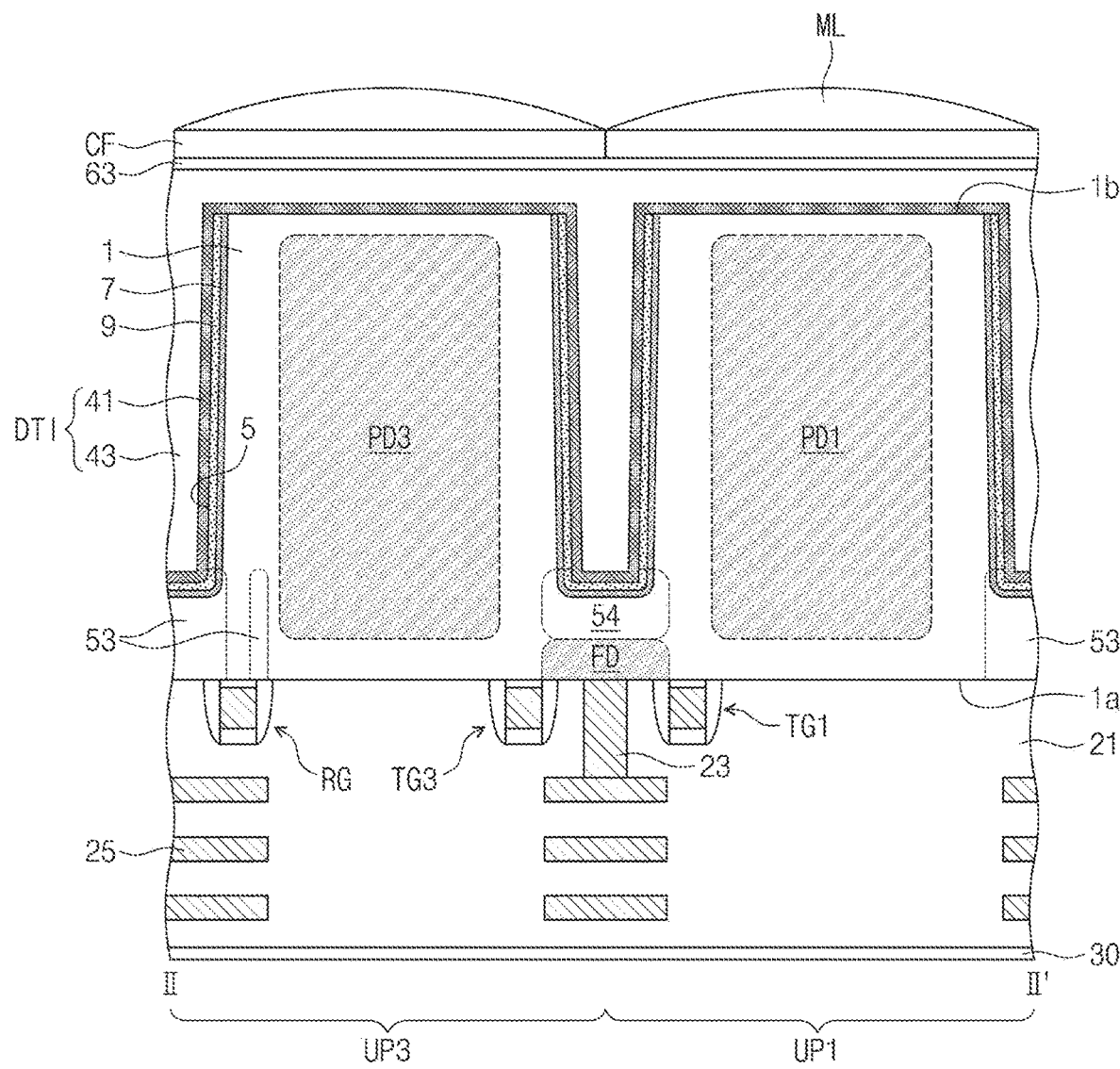
FIG. 19 illustrates a cross-sectional view taken along line II-II' of FIG. 18.

FIG. 18 illustrates a plan view showing an image sensor according to some example embodiments of the present inventive concepts. FIG. 19 illustrates a cross-sectional view taken along line II-II' of FIG. 18.

Referring to FIGS. 18 and 19, pixel areas UP1, UP2, UP3, and UP4 may include a first pixel area UP1, a second pixel area UP2, a third pixel area UP3, and a fourth pixel area UP4 that are adjacent to each other. The adjacent first to fourth pixel areas UP1 to UP4 may share a single floating diffusion region FD. The first pixel area UP1 may include a first transfer gate TG1 and a first photoelectric conversion section PD1 that is disposed in a substrate 1. The first pixel area UP1 may have the first transfer gate TG1 at its corner adjacent to the second to fourth pixel areas UP2 to UP4. The second pixel area UP2 may include a second transfer gate TG2 and a second photoelectric conversion section PD2 that is disposed in the substrate 1. The second pixel area UP2 may have the second transfer gate TG2 at its corner adjacent to the first, third, and fourth pixel areas UP1, UP3, and UP4.

A reset gate RG, a select gate SEL, and a source follower gate SF may be disposed on portions of the third and fourth pixel areas UP3 and UP4. For example, the third pixel area UP3 may include a third transfer gate TG3, a third photoelectric conversion section PD3 disposed in the substrate 1, the reset gate RG, and a portion of the source follower gate SF. The fourth pixel area UP4 may include a fourth transfer gate TG4, a fourth photoelectric conversion section PD4 disposed in the substrate 1, the select gate SEL, and other portion of the source follower gate SF.

The first to fourth photoelectric conversion sections PD1 to PD4 may include an impurity-doped region doped with impurities having an opposite conductivity type, such as N-type, to that of impurities doped in the substrate 1. The floating diffusion region FD may be doped with impurities having an opposite conductivity type, such as N-type, to that of impurities doped in the substrate 1.

An image sensor according to some embodiments may not include the shallow device isolation section STI of FIG. 2. The image sensor according to some embodiments may be configured such that a deep pixel trench 5 may be formed to extend from a second surface 1b of the substrate 1 toward a first surface 1a of the substrate 1. A deep pixel isolation section DTI may be spaced apart from the first surface 1a of the substrate 1. The deep pixel isolation section DTI may include a fixed charge layer 41 covering an inner/side wall and a bottom surface of the deep pixel trench 5 and also include a buried dielectric layer 43 filling the deep pixel trench 5. The deep pixel isolation section DTI may have a width that decreases as it approaches the first surface 1a from the second surface 1b. The fixed charge layer 41 may extend onto and contact the second surface 1b. The buried dielectric layer 43 may extend onto and cover the second surface 1b.

On the second surface 1b, a second passivation layer 63 may be disposed on the buried dielectric layer 43. The second passivation layer 63 may be formed of a silicon nitride layer. Color filters CF and micro-lenses ML may be formed on the second passivation layer 63.

The image sensor may include a device isolation region 53 in the substrate 1 and adjacent to the first surface 1a. Like the shallow device isolation section STI, the device isolation region 53 may be formed before forming the deep pixel trenches 5 and may define active regions on which drive transistors are disposed. The device isolation region 53 may be doped with impurities whose conductivity type is the same as that of impurities doped in the substrate 1, and may have an impurity concentration greater than that of the substrate 1. The floating diffusion region FD and the deep pixel isolation section DTI may be provided therebetween with a subsidiary device isolation region 54 between the adjacent first to fourth pixel areas UP1 to UP4. The subsidiary device isolation region 54 may include impurities whose conductivity type is the same as that of the impurities doped in the device isolation region 53. The subsidiary device isolation region 54 may have an impurity concentration equal to or similar to that of the device isolation region 53. Below the floating diffusion region FD, the subsidiary device isolation region 54 may impede/prevent the impurities of the floating diffusion region FD from diffusing toward the second surface 1b.

An amorphous region 7 and an electron suppress region 9 may be disposed on a portion of the substrate 1, which portion is adjacent to a sidewall of the deep pixel isolation section DTI. The amorphous region 7 and the electron suppress region 9 may extend close to the bottom surface of the deep pixel trench 5. The amorphous region 7 and the electron suppress region 9 may be interposed between the device isolation region 53 and the bottom surface of the deep pixel trench 5 and between the subsidiary device isolation region 54 and the bottom surface of the deep pixel trench 5. Alternatively, the amorphous region 7 and the electron suppress region 9 may extend into the device isolation region 53 and the subsidiary device isolation region 54. Thus, the device isolation region 53 and the subsidiary device isolation region 54 may have portions doped with carbon ions and/or germanium ions.

Other configurations of the image sensor shown in FIG. 19 may be identical or similar to those discussed with reference to FIGS. 1 and 2. The image sensor may operate similarly to that discussed with reference to the circuit diagram shown in FIG. 3, and may sense via the first to fourth pixel areas UP1 to UP4.

Figure 20:
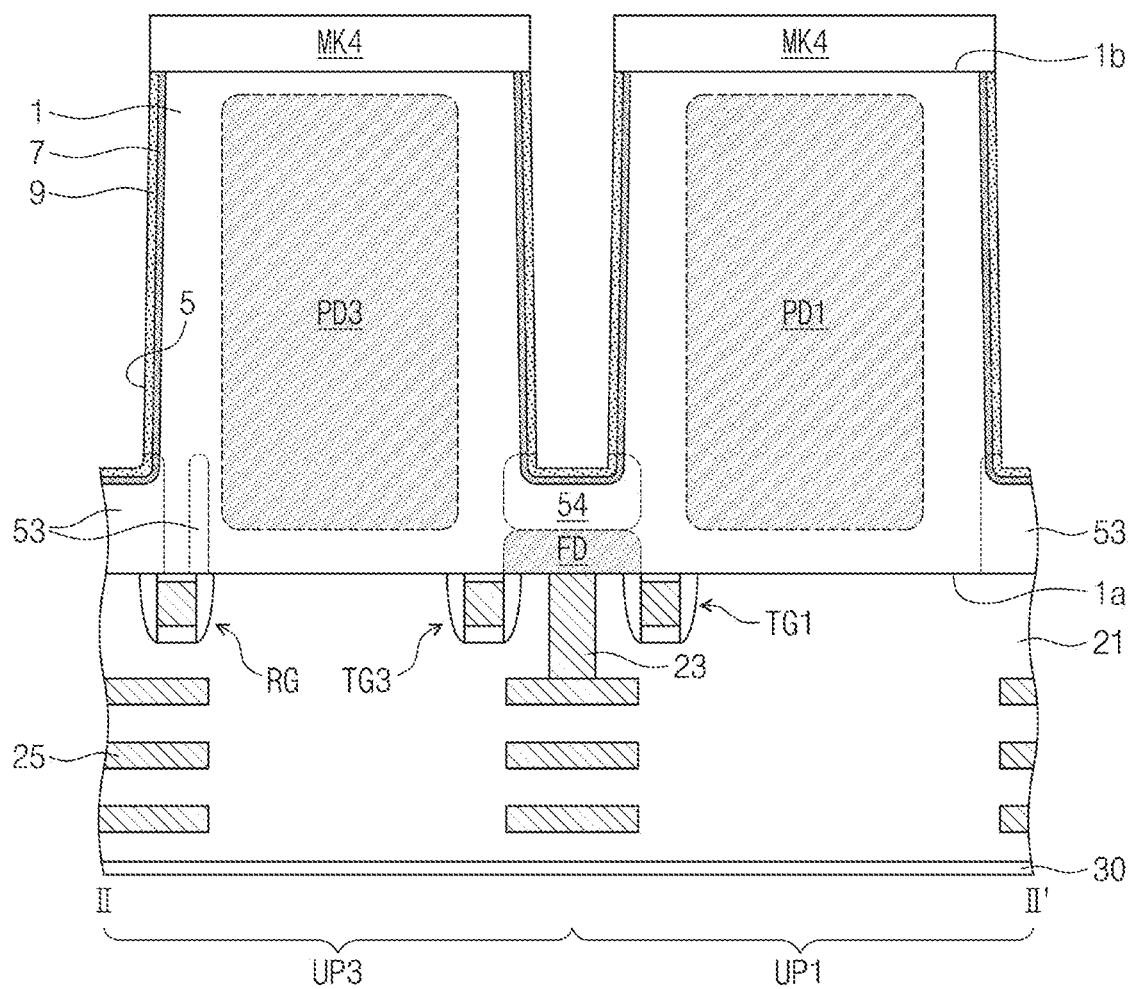
FIG. 20 illustrates a cross-sectional view showing a method of fabricating an image sensor having the cross-section of FIG. 19.

FIG. 20 illustrates a cross-sectional view showing a method of fabricating an image sensor having the cross-section of FIG. 19.

Referring to FIGS. 18 and 20, first, second, third, and fourth photoelectric conversion sections PD1, PD2, PD3, and PD4 may be formed in a substrate 1. A device isolation region 53 and a subsidiary device isolation region 54 may be formed in a portion of the substrate 1, which portion is adjacent to a first surface 1a of the substrate 1. First, second, third, and fourth transfer gates TG1, TG2, TG3, and TG4, a reset gate RG, a select gate SEL, and a source follower gate SF may be formed on the first surface 1a of the substrate 1. A floating diffusion region FD may be formed in the substrate 1 between first, second, third, and fourth pixel areas UP1, UP2, UP3, and UP4 that are adjacent to each other. A plurality of interlayer dielectric layers 21, a contact plug 23, connection lines 25, and a first passivation layer 30 may be formed on the first surface 1a of the substrate 1. A grinding process may be performed to partially remove a second surface 1b of the substrate 1, allowing the substrate 1 to have a desirable thickness. A fourth mask pattern MK4 may be formed on the second surface 1b of the substrate 1, which fourth mask pattern MK4 may have an opening that defines a position of a deep pixel isolation section DTI which will be discussed below. The fourth mask pattern MK4 may be used as an etching mask to etch the substrate 1 to form a deep pixel trench 5. The deep pixel trench 5 may expose the device isolation region 53 and the subsidiary device isolation region 54. An amorphous region 7 and an electron suppress region 9 may be formed as discussed with reference to FIGS. 5 and 6. The amorphous region 7 and the electron suppress region 9 may be formed adjacent to the bottom surface of the deep pixel trench 5. Thus, the amorphous region 7 may be formed within the device isolation region 53 and the subsidiary device isolation region 54.

Subsequently, referring back to FIG. 19, the fourth mask pattern MK4 may be removed to expose the second surface 1b. A fixed charge layer 41 may be conformally formed on the second surface 1b of the substrate 1. A buried dielectric layer 43 may be formed on the fixed charge layer 41 to form a deep pixel isolation section DTI filling the deep pixel trench 5. A second passivation layer 63, color filters CF, and micro-lenses ML may be formed on the buried dielectric layer 43.

Figure 21:
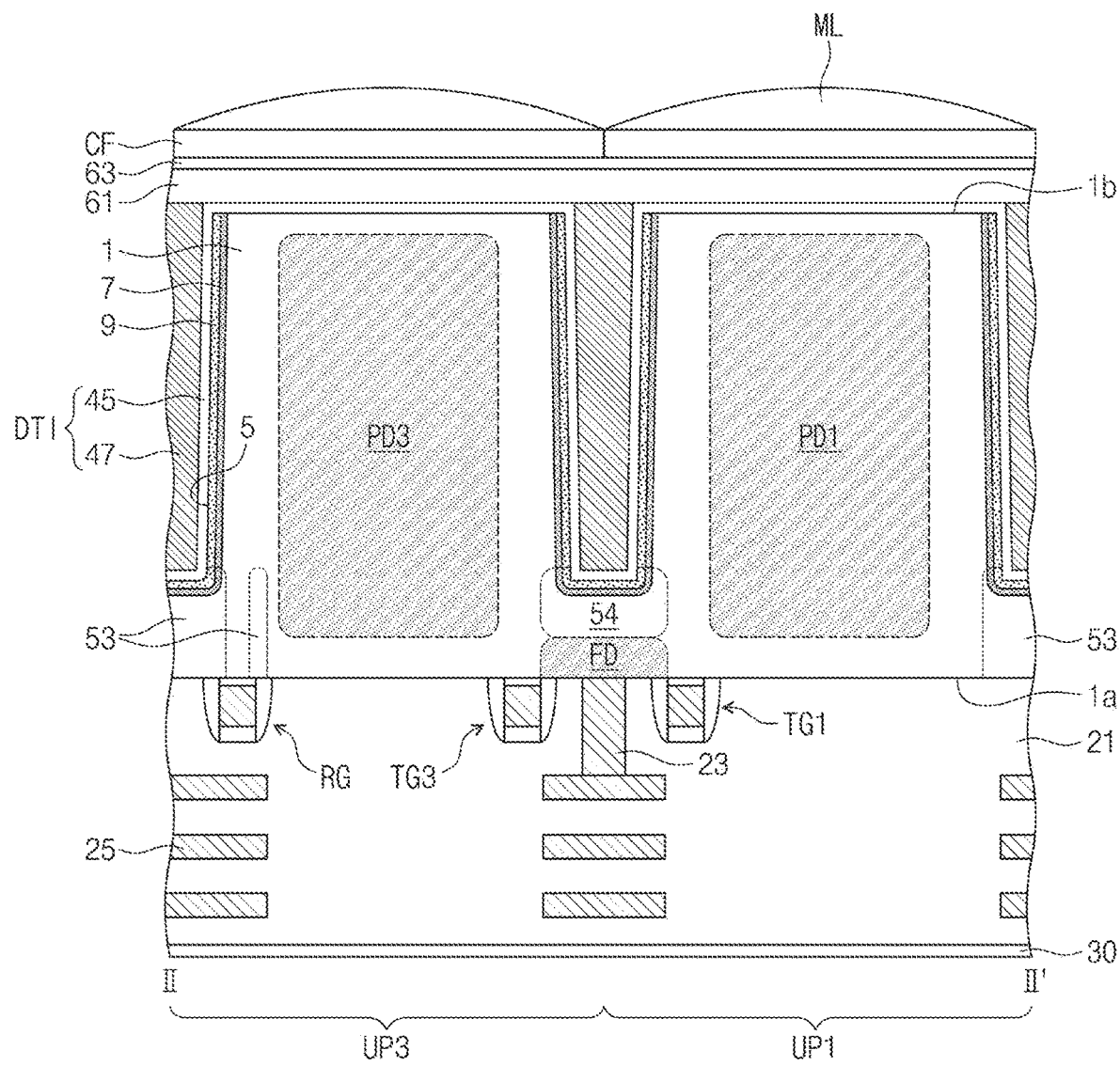
FIG. 21 illustrates a cross-sectional view taken along line II-II' of FIG. 18.

FIG. 21 illustrates a cross-sectional view taken along line II-II' of FIG. 18.

Referring to FIG. 21, an image sensor according to some embodiments may be configured such that the deep pixel isolation section DTI may include a dielectric liner 45 conformally covering the inner/side wall and the bottom surface of the deep pixel trench 5 and also include a conductive pattern 47 filing the deep pixel trench 5. The dielectric liner 45 may extend onto the second surface 1b of the substrate 1. The conductive pattern 47 may have a top surface coplanar with that of the dielectric liner 45 on the second surface 1b. A planarized layer 61 may be disposed on the dielectric liner 45 and the conductive pattern 47. The planarized layer 61 may be formed of a silicon oxide layer or a photoresist layer with no pigment. The second passivation layer 63, the color filters CF, and the micro-lenses ML may be sequentially disposed on the planarized layer 61.

In an image sensor and a method of fabricating the same according to some example embodiments of the present inventive concepts, it may be possible to suppress loss of light and to improve dark current characteristics. In addition, it may be possible to inhibit deterioration of FWC characteristics and to improve photosensivity.

Though the present inventive concepts have been described in connection with some example embodiments illustrated in the accompanying drawings, it will be understood by those skilled in the art that various changes/modifications/substitutions may be made without departing from the scope of the present inventive concepts, as defined by the following claims.

What is claimed is:

1. A method of fabricating an image sensor, the method comprising:
   etching a substrate to form a plurality of deep pixel trenches that separate a plurality of pixel areas from each other;
   performing a first plasma doping process to dope the substrate with ions of carbon, germanium, or both carbon and germanium, to thereby form a first amorphous region in the substrate adjacent sidewalls and bottom surfaces of the plurality of deep pixel trenches;
   performing a second plasma doping process to dope the substrate with boron ions, to thereby form a first electron suppression region in the substrate adjacent the sidewalls and the bottom surfaces of the plurality of deep pixel trenches;
   performing an annealing process;
   forming a first fixed charge layer in the plurality of deep pixel trenches to be in contact with the first electron suppression region;
   forming a plurality of deep device isolation regions in the plurality of deep pixel trenches; and
   after forming the plurality of deep device isolation regions, performing a grinding process to remove portions of the substrate, the first amorphous region and the first electron suppression region under the deep device isolation regions and to expose bottom surfaces of the deep device isolation regions.

2. The method of claim 1, further comprising forming a shallow device isolation region in the substrate before forming the plurality of deep pixel trenches,
wherein forming the plurality of deep pixel trenches further comprises etching the shallow device isolation region.

3. The method of claim 2, further comprising, before forming the shallow device isolation region:
etching a portion of the substrate to form a shallow device trench;
forming a second amorphous region by implanting ions of carbon, germanium, or both carbon and germanium into the substrate adjacent a sidewall and a bottom surface of the shallow device trench; and
forming a second electron suppression region by implanting boron ions into the substrate adjacent the sidewall and the bottom surface of the shallow device trench,
wherein the shallow device isolation region is formed in the shallow device trench.

4. The method of claim 2, wherein the first amorphous region and the first electron suppression region are not formed in the shallow device isolation region.

5. The method of claim 1, wherein each of the plurality of deep pixel trenches is formed to have a dual trench structure that has different widths.

6. The method of claim 5, wherein, before forming the plurality of deep pixel trenches, the method further comprises:
forming a floating diffusion region in the substrate adjacent the first surface and spaced apart from the device isolation region; and
forming a subsidiary device isolation region that is in the substrate, in contact with the floating diffusion region, and spaced apart from the device isolation region.

7. The method of claim 1,
wherein the substrate has a first surface and a second surface that is opposite the first surface,
wherein forming the plurality of deep pixel trenches comprises etching the substrate from the second surface toward the first surface, and
wherein the method further comprises, before forming the plurality of deep pixel trenches, forming a device isolation region in the substrate adjacent the first surface.

8. The method of claim 1, after performing the grinding process, further comprising:
forming a second fixed charge layer that is in contact with the bottom surfaces of the deep device isolation regions and respective bottom surfaces of the substrate, the first amorphous region, and the first electron suppression region.

9. The method of claim 1, after forming the plurality of deep device isolation regions, further comprising:
forming a gate on the substrate;
forming a floating diffusion region in the substrate at a side of the gate;
forming an ohmic layer on the floating diffusion region;
forming an interlayer dielectric layer on the ohmic layer; and
forming a connection line on the interlayer dielectric layer, wherein the connection line is electrically connected to the floating diffusion region.

10. The method of claim 1, wherein the forming of the plurality of deep device isolation regions includes:
forming dielectric liners to cover inner walls of the plurality of deep pixel trenches, respectively; and then
forming conductive patterns to fill the plurality of deep pixel trenches, respectively.

11. The method of claim 1, wherein the first fixed charge layer is formed before forming the plurality of deep device isolation regions.

12. A method of fabricating an image sensor, the method comprising:
forming a shallow device isolation region in a substrate
etching the shallow device isolation region and the substrate below the shallow device isolation region to form a deep pixel trench;
performing a first plasma doping process to dope the substrate with ions of carbon, germanium, or both carbon and germanium, to thereby form an amorphous region in the substrate adjacent to the deep pixel trench;
performing a second plasma doping process to dope the substrate with boron ions, to thereby form an electron suppression region in the substrate adjacent to the deep pixel trench;
performing an annealing process;
forming a first fixed charge layer in the deep pixel trench to be in contact with the electron suppression region; and
forming a deep device isolation region in the deep pixel trench;
after forming the deep device isolation region, performing a grinding process to remove portions of the substrate, the amorphous region and the electron suppression region under the deep device isolation region and to expose a bottom surface of the deep device isolation region.

13. The method of claim 12, wherein the amorphous region and the electron suppression region are not formed in the shallow device isolation region.

14. The method of claim 12, wherein the first fixed charge layer is formed before forming the deep device isolation region.

15. The method of claim 12, wherein the forming of the deep device isolation region includes:
forming a dielectric liner to cover an inner wall of the deep pixel trench; and
forming a conductive pattern to fill the deep pixel trench.

16. The method of claim 12,
after performing the grinding process, further comprising:
forming a second fixed charge layer that is in contact with the bottom surface of the deep device isolation region and respective bottom surfaces of the substrate, the amorphous region, and the electron suppression region.

17. A method of fabricating an image sensor, the method comprising:
etching a substrate to form a plurality of deep pixel trenches that separate a plurality of pixel areas from each other;
performing a first plasma doping process to dope the substrate with ions of carbon, germanium, or both carbon and germanium, to thereby form a first amorphous region in the substrate adjacent sidewalls and bottom surfaces of the plurality of deep pixel trenches;
performing a second plasma doping process to dope the substrate with boron ions, to thereby form a first electron suppression region in the substrate adjacent the sidewalls and the bottom surfaces of the plurality of deep pixel trenches;
performing an annealing process;

forming a plurality of deep device isolation regions in the plurality of deep pixel trenches; and after forming the plurality of deep device isolation regions, performing a grinding process to remove portions of the substrate, the first amorphous region and the first electron suppression region under the deep device isolation regions and to expose bottom surfaces of the deep device isolation regions.

18. The method of claim 17, after forming the plurality of deep device isolation regions, further comprising:

forming a gate on the substrate;

forming a floating diffusion region in the substrate at a side of the gate;

forming an ohmic layer on the floating diffusion region;

forming an interlayer dielectric layer on the ohmic layer; and forming a connection line on the interlayer dielectric layer, wherein the connection line is electrically connected to the floating diffusion region.

19. The method of claim 17, wherein each of the plurality of deep pixel trenches is formed to have a dual trench structure that has different widths.

\* \* \* \* \*